(12) United States Patent
Prechtl et al.

(10) Patent No.: US 10,062,630 B2
(45) Date of Patent: Aug. 28, 2018

(54) WATER AND ION BARRIER FOR THE PERIPHERY OF III-V SEMICONDUCTOR DIES

(71) Applicant: Infineon Technologies Austria AG, Villach (AT)

(72) Inventors: Gerhard Prechtl, Rosegg (AT); Oliver Haeberlen, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 52 days.

(21) Appl. No.: 14/985,868

(22) Filed: Dec. 31, 2015

(65) Prior Publication Data

US 2017/0194230 A1 Jul. 6, 2017

(51) Int. Cl.

| | |
|---|---|
| *H01L 29/08* | (2006.01) |
| *H01L 29/423* | (2006.01) |
| *H01L 29/36* | (2006.01) |
| *H01L 29/207* | (2006.01) |
| *H01L 29/778* | (2006.01) |
| *H01L 29/10* | (2006.01) |
| *H01L 23/31* | (2006.01) |
| *H01L 21/02* | (2006.01) |
| *H01L 21/306* | (2006.01) |
| *H01L 21/3205* | (2006.01) |
| *H01L 21/56* | (2006.01) |
| *H01L 21/78* | (2006.01) |
| *H01L 23/29* | (2006.01) |

(Continued)

(52) U.S. Cl.
CPC ...... *H01L 23/3192* (2013.01); *H01L 21/0214* (2013.01); *H01L 21/0217* (2013.01); *H01L 21/30612* (2013.01); *H01L 21/32051* (2013.01); *H01L 21/56* (2013.01); *H01L 21/78* (2013.01); *H01L 23/291* (2013.01); *H01L 23/564* (2013.01); *H01L 23/585* (2013.01); *H01L 29/2003* (2013.01); *H01L 29/7787* (2013.01)

(58) Field of Classification Search
CPC .... G03F 7/16; G02F 1/13439; Y10S 438/949; H01L 51/561; H01L 51/5237; H01L 29/41758; H01L 29/66712; H01L 29/41766; H01L 29/4236; H01L 23/3178; H01L 29/267; H01L 29/452; H01L 29/1095; H01L 29/2003; H05K 3/0011
See application file for complete search history.

(56) References Cited

U.S. PATENT DOCUMENTS 5,712,206 A 1/1998 Chen
5,841,190 A * 11/1998 Noda .................. H01L 23/3107
257/668

(Continued)

*Primary Examiner* — Mary Wilczewski
*Assistant Examiner* — Tsz Chiu
(74) *Attorney, Agent, or Firm* — Murphy, Bilak & Homiller, PLLC

(57) ABSTRACT

A semiconductor die includes an III-V semiconductor body having a periphery devoid of active devices, the periphery terminating at an edge face of the semiconductor die. The semiconductor die further includes a seal ring structure above the periphery of the III-V semiconductor body and a barrier. The barrier is disposed over the periphery of the III-V semiconductor body at least between the seal ring structure and the edge face of the semiconductor die. The barrier has a density which prevents water, water ions, sodium ions and potassium ions from diffusing through the barrier.

15 Claims, 29 Drawing Sheets

(51) Int. Cl.
*H01L 23/00* (2006.01)
*H01L 23/58* (2006.01)
*H01L 29/20* (2006.01)

(56) References Cited

U.S. PATENT DOCUMENTS

| | | |
|---|---|---|
| 7,595,209 B1 * | 9/2009 | Monadgemi .......... B81B 7/0054 |
| | | 257/E21.499 |
| 8,941,218 B1 | 1/2015 | Perkins et al. |
| 8,969,921 B2 * | 3/2015 | Okamoto ............ H01L 21/8252 |
| | | 257/201 |
| 9,305,995 B1 | 4/2016 | Sun |
| 2002/0153529 A1 | 10/2002 | Shie |
| 2003/0165781 A1 * | 9/2003 | Takeda ...................... G03F 7/16 |
| | | 430/319 |
| 2006/0219997 A1 * | 10/2006 | Kawasaki ........... H01L 29/7789 |
| | | 257/12 |
| 2007/0045688 A1 | 3/2007 | Sashida |
| 2008/0001291 A1 | 1/2008 | Nagai |
| 2008/0073685 A1 | 3/2008 | Wang |
| 2008/0087897 A1 * | 4/2008 | Iwakami ............... H01L 29/452 |
| | | 257/76 |
| 2008/0121896 A1 * | 5/2008 | Takizawa ........... H01L 21/3185 |
| | | 257/76 |
| 2008/0185623 A1 | 8/2008 | Sashida |
| 2008/0211066 A1 | 9/2008 | Akedo et al. |
| 2008/0224195 A1 | 9/2008 | Wang et al. |
| 2008/0258195 A1 | 10/2008 | Sugawara et al. |
| 2011/0169135 A1 | 7/2011 | Nakao |
| 2012/0115300 A1 | 5/2012 | Hirota et al. |
| 2012/0218796 A1 * | 8/2012 | Okamoto ............ H01L 29/0615 |
| | | 363/126 |
| 2012/0305992 A1 | 12/2012 | Marino et al. |
| 2012/0307534 A1 | 12/2012 | Yamada |
| 2013/0153923 A1 | 6/2013 | DeCoutere |
| 2013/0228929 A1 | 9/2013 | Meinhold et al. |
| 2013/0256685 A1 * | 10/2013 | Ohki ..................... H01L 29/778 |
| | | 257/76 |
| 2013/0277680 A1 | 10/2013 | Green et al. |
| 2013/0288438 A1 | 10/2013 | Jensen et al. |
| 2014/0061659 A1 | 3/2014 | Teplik et al. |
| 2015/0004718 A1 | 1/2015 | Sun et al. |
| 2015/0072441 A1 | 3/2015 | Sun |
| 2015/0137187 A1 * | 5/2015 | Aoki ................ H01L 21/30612 |
| | | 257/201 |
| 2015/0155359 A1 | 6/2015 | Tsai et al. |
| 2015/0206893 A1 | 7/2015 | Sun et al. |
| 2015/0221658 A1 | 8/2015 | Wang |
| 2015/0311084 A1 | 10/2015 | Moore et al. |
| 2015/0325523 A1 | 11/2015 | Leobandung |
| 2016/0049375 A1 * | 2/2016 | Kume .................... H01L 29/267 |
| | | 257/76 |
| 2016/0141423 A1 | 5/2016 | Diaz et al. |
| 2016/0172194 A1 | 6/2016 | Kunnen et al. |
| 2016/0190321 A1 | 6/2016 | Wang et al. |
| 2017/0243936 A1 * | 8/2017 | Ostermaier ....... H01L 21/76879 |
| 2017/0256638 A1 * | 9/2017 | MacElwee .......... H01L 29/7787 |
| 2018/0012770 A1 * | 1/2018 | MacElwee ........ H01L 21/30612 |

* cited by examiner

WATER AND ION BARRIER FOR THE PERIPHERY OF III-V SEMICONDUCTOR DIES

TECHNICAL FIELD

The present application relates to III-V semiconductor dies, in particular a water and ion barrier for the periphery of III-V semiconductor dies.

BACKGROUND

GaN based semiconductors provide superior performance figure of merits compared to silicon based semiconductors due to outstanding material properties. Additionally GaN based semiconductors are also very robust against oxidation and other chemicals. However, this robust aspect is not valid if high electric fields are applied on a GaN device within a humid environment. The combination of a high electric field and moisture leads to severe oxidation of the GaN or AlGaN surface layer, and therefore to destruction of the device. The reduction-oxidation (redox) reaction between an $Al_xGa_{1-x}N$ surface layer and water is given by:

$$2Al_xGa_{1-x}N + 3H_2O = xAl_2O_3 + (1-x)Ga_2O_3 + N_2\uparrow + 3H_2\uparrow. \quad (1)$$

In the electrochemical cell, the gate metal acts as the cathode which provides electrons to the water at the interface. The corresponding reduction reaction for the water is given by:

$$2H_2O + 2e^- = H_2 + 2OH^-. \quad (2)$$

The electrons contribute to the total gate current. On the other hand, the $Al_xGa_{1-x}N$ surface layer acts as the anode and is decomposed and subsequently anodically oxidized in the presence of holes and hydroxyl ions (OH—) as given by the following reactions:

$$2Al_xGa_{1-x}N + 6h^+ = 2xAl^{3+} + 2(1-x)Ga^{3+} + N_2\uparrow \quad (3)$$

and $$2xAl^{3+} + 2(1-x)Ga^{3+} + 6OH^- = xAl_2O_3 + (1-x)Ga_2O_3 + 3H_2O. \quad (4)$$

In summary, for the corrosion process to happen, it is necessary that: (1) holes are available at the top III-Nitride surface layer during high off-state drain bias conditions; and (2) water ions (e.g. $OH^-$ and $H_3O^+$) from the ambient diffuse/permeate through the uppermost passivation layer and reach the III-Nitride surface layer. Under high applied fields, holes can be generated by either impact ionization or by inter-band tunneling (trap assisted).

With the high applied fields, holes can be generated by either impact ionization or by Inter-band tunneling (trap assisted). Based on these reactions, the introduction of humidity into the GaN transistor cell field or at GaN regions with high fields must be avoided. Many GaN dies are fabricated from the same wafer. During the manufacturing process, the dies are physically separated from one another by sawing or laser dicing along singulation streets. The singulation streets divide adjacent dies and provide sufficient space to singulate the dies. During singulation, mechanical damage at the sidewall of each die often occurs e.g. cracking. To limit the damage caused by the singulation process on device performance, each die is typically surrounded by a seal ring to protect the dies from the physical damage. The seal ring can be floating or connected to ground. By grounding the seal ring, defined edge potentials are provided at the die sidewall.

The seal ring, which typically includes metal runners which surround the die periphery, are often in contact with the uppermost GaN layer and covered with a passivation which consists of a combination of oxides and nitrides. After singulation, the passivation is interrupted at the sawing location along the sidewall of each die. Humidity can enter into the exposed part of the oxide at the die sidewall. Oxides have low density and therefore do no function as a barrier against the diffusion of water and other ions.

In GaN-based device structures, an additional GaN feature exasperates the water/ion diffusion problem. During singulation, the GaN sidewall is open and not protected. Due to the layered GaN buffer structure, low ohmic lateral paths can be formed within the stacked layers due to improper layer design or improper compensation. This is obvious due to the polarization jump in the layer stack sequence in that a 2DEG (two-dimensional electron gas) and a 2DHG (two-dimensional hole gas) must be formed. A similar mechanism is desired to form a 2DEG channel in the active region of a GaN HEMT device. If these layers are buried enough, these channels are not clearly visible in the lateral leakage behavior and also the breakdown of the device is not strongly affected. However, these laterally conductive layers, even if they are highly resistive, can lead to potential differences at the open GaN surface which results from the singulation process, even if the seal ring and the backside of the chip are grounded. By applying a high field at the drain contact of the device, a non-zero potential is realized at the GaN die edge. With this condition, water and other ions can react with the GaN and deteriorate the GaN layers leading to delamination issues in humid environments.

Accordingly, there is a need for an improved seal ring barrier which avoids diffusion of water and other ions into the active device region of a GaN device.

SUMMARY

According to an embodiment of a semiconductor die, the semiconductor die comprises an III-V semiconductor body having a periphery devoid of active devices, the periphery terminating at an edge face of the semiconductor die. The semiconductor die further comprises a seal ring structure above the periphery of the III-V semiconductor body and a barrier. The barrier is disposed over the periphery of the III-V semiconductor body at least between the seal ring structure and the edge face of the semiconductor die. The barrier has a density which prevents water, water ions (e.g. $OH^-$ and $H_3O^+$), sodium ions and potassium ions from diffusing through the barrier.

According to an embodiment of a method of manufacturing a plurality of semiconductor dies, the method comprises: providing an III-V semiconductor body with a plurality of semiconductor dies, each semiconductor die having a periphery devoid of active devices; forming a seal ring structure above the periphery of the III-V semiconductor body; forming a barrier over the periphery of each semiconductor die at least between the seal ring structure and singulation streets of the III-V semiconductor body which separate the semiconductor dies from one another, the barrier having a density which prevents water, water ions, sodium ions and potassium ions from diffusing through the barrier; and separating the semiconductor dies from one another along the singulation streets. The periphery of each semiconductor die terminates at an edge face of that semiconductor die after separation from the other semiconductor dies.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a barrier in the periphery of an III-V semiconductor die, the barrier having a density which prevents water, water ions (e.g. $OH^-$ and $H_3O^+$), sodium ions and potassium ions from diffusing through the barrier. The barrier is configured to block water, water ions, sodium ions and potassium ions from diffusing inward beyond the seal ring structure of the III-V semiconductor die. The barrier can have various configurations as described in more detail below.

Figure 1:
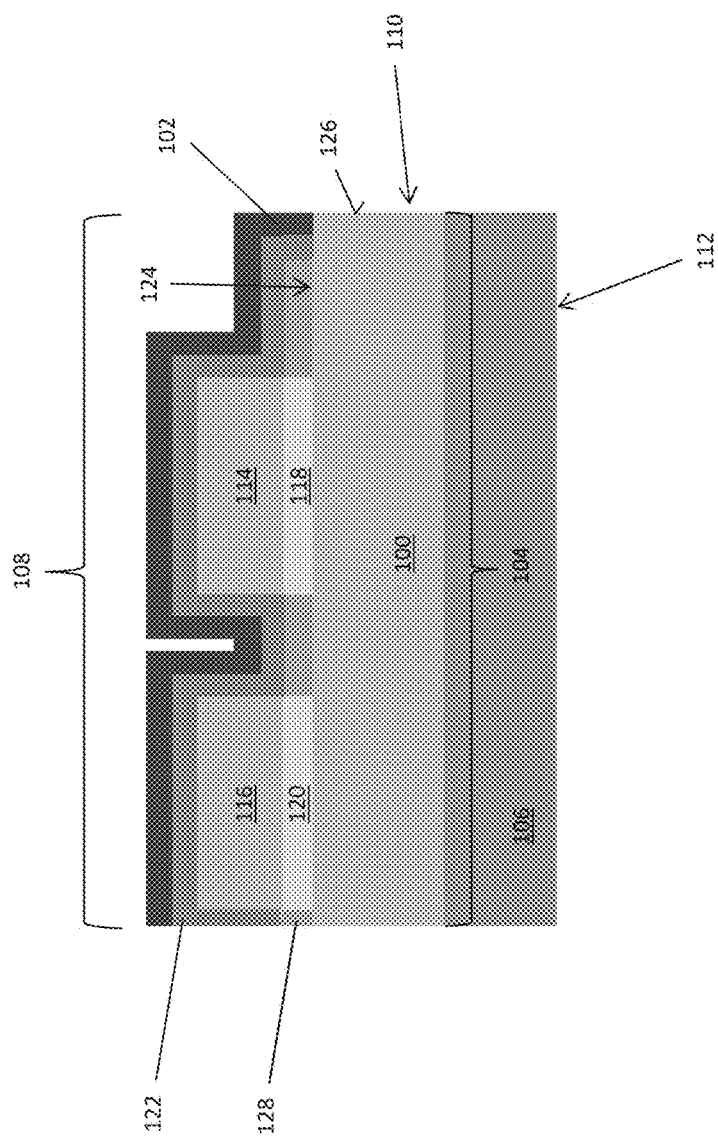
FIG. 1 illustrates a partial sectional view of an embodiment of an III-V semiconductor die having a barrier in the periphery of the die.

FIG. 1 illustrates a partial sectional view of an embodiment of an III-V semiconductor die having an III-V semiconductor body 100 and a barrier 102 in the periphery 104 of the III-V semiconductor body. A device is formed in an active region of the III-V semiconductor body 100, the active region being surrounded by the periphery 104 and out of view in FIG. 1. In the case of an III-nitride device, the semiconductor body 100 can include an III-nitride buffer and an III-nitride barrier which form a heterostructure. In one embodiment, the III-V semiconductor die is a GaN-based HEMT. Specifically with regard to GaN technology, the presence of polarization charges and strain effects in a GaN-based heterostructure body 100 due to spontaneous and piezoelectric polarization yield a two-dimensional charge carrier gas in the active region of the heterostructure body 100 characterized by very high carrier density and carrier mobility. This two-dimensional charge carrier gas, such as a 2DEG (two-dimensional electron gas) or 2DHG (two-dimensional hole gas), forms the conductive channel of the device near the interface between the III-nitride barrier, e.g., a GaN alloy barrier such as AlGaN, InAlGaN, InAlN, etc. and the III-nitride buffer, e.g., a GaN buffer. A thin, e.g. 1-2 nm, AlN layer can be provided between the GaN buffer and the GaN alloy barrier to minimize alloy scattering and enhance 2DEG mobility. Again, these features are provided in the active region of the III-V semiconductor body 100 which is out of view in FIG. 1.

In a broad sense, the semiconductor dies described herein can be formed from any binary, ternary or quaternary III-nitride compound semiconductor material where piezoelectric effects or a heterojunction is responsible for the device concept. The III-V semiconductor body 100 can be manufactured on a semiconductor substrate 106 such as a Si, SiC or sapphire substrate, on which a nucleation (seed) layer such as an AlN layer can be formed for providing thermal and lattice matching to the III-V semiconductor body 100. The III-V semiconductor body 100 may also have AlInN/AlN/GaN barrier/spacer/buffer layer structures. In general, the III-V semiconductor body 100 can be realized using any suitable III-V technology such as GaAs, GaN, etc.

The semiconductor die also includes a seal ring structure 108 above the periphery 104 of the III-V semiconductor body 100. The periphery 104 of the III-V semiconductor 100 body surrounds the active region (out of view), and is devoid of active devices. The periphery 104 terminates at an edge face 110 of the semiconductor die. The seal ring structure 108 protects the die from physical damage caused during the singulation process i.e. the process used to separate dies from one another. The seal ring structure 108 can be electrically floating or connected to ground. The backside 112 of the die also can be connected to ground. By grounding the seal ring structure 108, defined edge potentials are provided at the edge face 110 of the die.

The seal ring structure 108 shown in FIG. 1 includes two metal rings 114, 116 spaced apart from one another. Each ring can be connected to the III-V semiconductor body 100 by an optional contact metal 118, 120, and surrounds the periphery 104 of the III-V semiconductor body 100, encircling the inner active region of the die. The seal ring structure 108 can have a single metal ring 114, two metal rings 114, 116 as shown in FIG. 1, more than two metal rings, or different types of metal structures configured to protect the die from physical damage caused during the singulation process.

An insulating layer 122 covers the seal ring structure 108. The insulating layer 122 has a density which is insufficient to prevent diffusion of water, water ions, sodium ions and potassium ions. In one embodiment, the insulating layer 122 comprises an oxide. In another embodiment, the insulating layer 122 comprises a low density silicon nitride layer. The insulating layer 122 can comprise one or more materials and one or more sub-layers e.g. such as combination of two or more of tetraethoxysilane (TENS), undoped $SiO_2$ (USG), F-doped oxide (FSG), phosphosilicate glass (PSG), borophosphosilicate glass (BPSG), low-k dielectric, etc. In one example, the insulating layer 122 can include low density silicon nitride on oxide. As such, the term "insulating layer" as used herein does not refer to only a single layer of insulating material, but instead covers both a single layer of insulating material and a stack of two or more different insulating materials. In each case, the insulating layer 122, if present, has a density which is insufficient to prevent diffusion of water, water ions, sodium ions and potassium ions. The barrier 102 covers the insulating layer 122 if the insulating layer 122 is present.

The barrier 102 has a density which prevents water, water ions, sodium ions and potassium ions from diffusing through the barrier 102. The barrier 102 is configured to block water, water ions, sodium ions and potassium ions from diffusing through the insulating layer 122 inward beyond the seal ring structure 108. This way, water, water ions, sodium ions and potassium ions are prevented from entering the active region of the die. In the case of an III-nitride material system e.g. of the kinds previously described herein, the barrier 102 also prevents oxidation of the nitride-based surface of the III-V semiconductor body 100 by blocking water and water ions. Silicon oxynitride and silicon nitride are effective barriers against water, water ions, sodium ions and potassium ions, and are compatible with standard silicon processing technologies. Still other types of water/ion barrier materials can be used. The barrier 102 can comprise a single layer of the same material e.g. silicon oxynitride or silicon nitride or a plurality of layers of different materials e.g. silicon oxynitride encased by silicon nitride. The III-V semiconductor die is shown without a top passivation layer for ease of illustration, but can be provided with such a passivation layer if desired. A passivation layer 128 can be applied to the top main surface 124 of the III-V semiconductor body 100.

According to the embodiment shown in FIG. 1, the barrier 102 terminates the seal ring structure 108 and touches the top surface 124 of the III-V semiconductor body 100. Accordingly, the underlying insulating layer 122 is encased by the barrier 102 at the edge face 110 of the semiconductor die to block water and other ions from entering the active device region. The sidewall 126 of the III-V semiconductor body 100 remains uncovered by the barrier 102 according to this embodiment. Such a configuration is most effective if the III-V semiconductor body 100 is potential free at the exposed sidewall 126 i.e. the singulation edge.

FIGS. 2A through 2F illustrate partial sectional views of the III-V semiconductor die shown in FIG. 1, during different stages of an embodiment of manufacturing the seal ring structure 108 with the water/ion barrier 102.

Figure 2A:
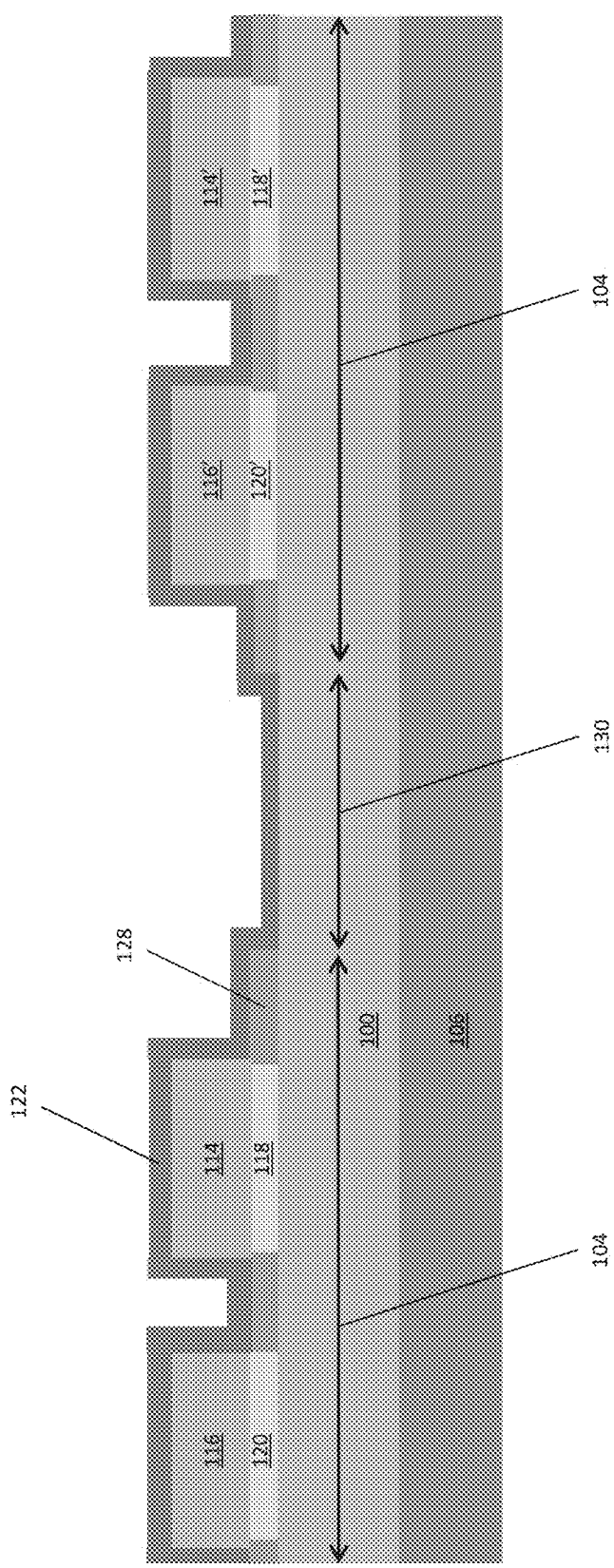
FIGS. 2A through 2F illustrate partial sectional views of the periphery of the III-V semiconductor die shown in FIG. 1 during different stages of an embodiment of manufacturing the seal ring structure with water/ion barrier.

In FIG. 2A, the III-V semiconductor body 100 has been provided and the seal ring structure 108 formed. The insulating layer 122 is formed over the seal ring structure 108 and covers the singulation streets 130 between adjacent semiconductor dies disposed on the same semiconductor substrate 106. Each singulation street 130 defines the region where two adjacent semiconductor dies are singulated i.e. physically separated from one another by sawing, laser dicing, etc. Alternatively, the insulating layer 122 can be omitted in the periphery 104 of the III-V semiconductor body 100, meaning that the barrier material will be later formed directly on the seal ring structure 108.

Figure 2B:
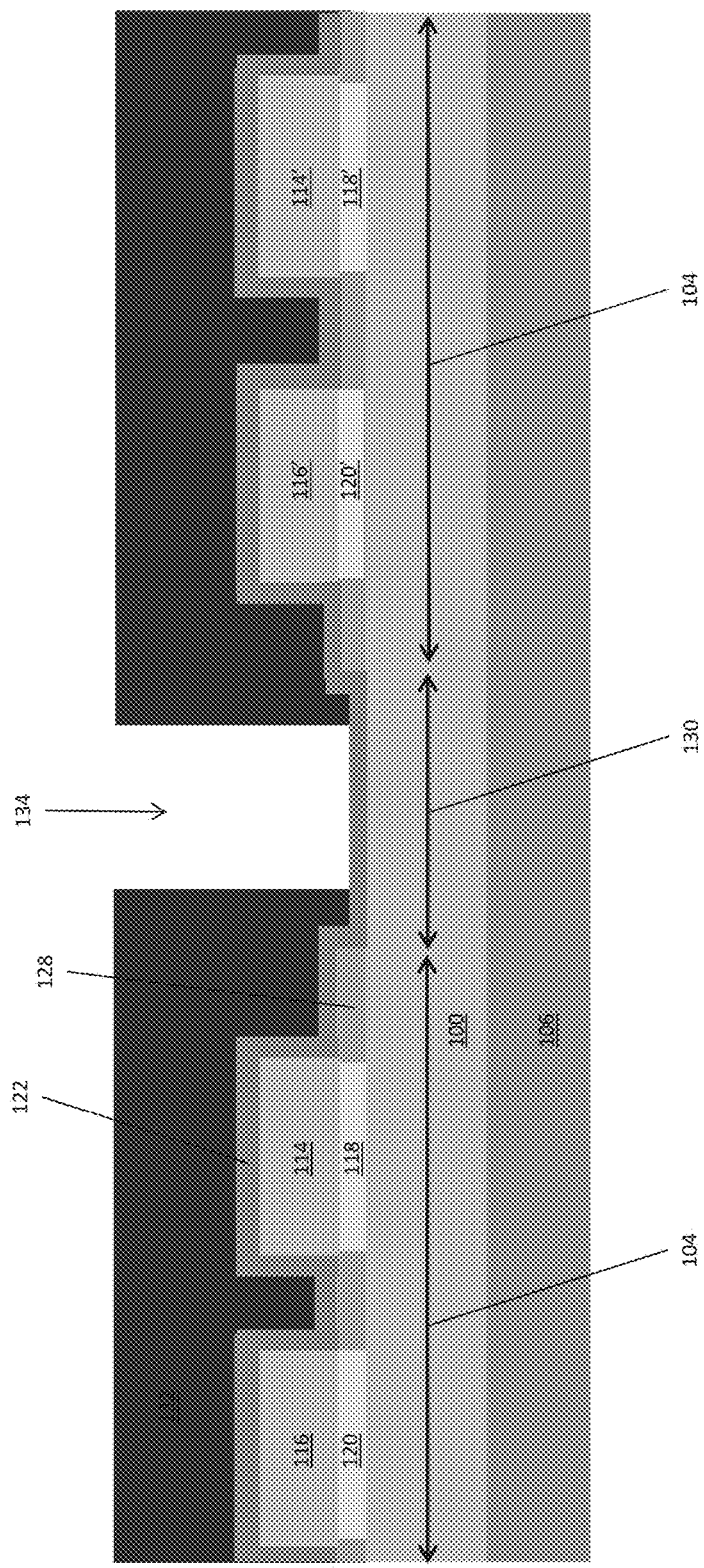

In FIG. 2B, a mask 132 e.g. made of photoresist is formed on the insulating layer 122. The mask 132 has openings 134 over the singulation streets 130. The openings 134 in the mask 132 expose parts of the insulating layer 122 disposed over the singulation streets 130.

Figure 2C:
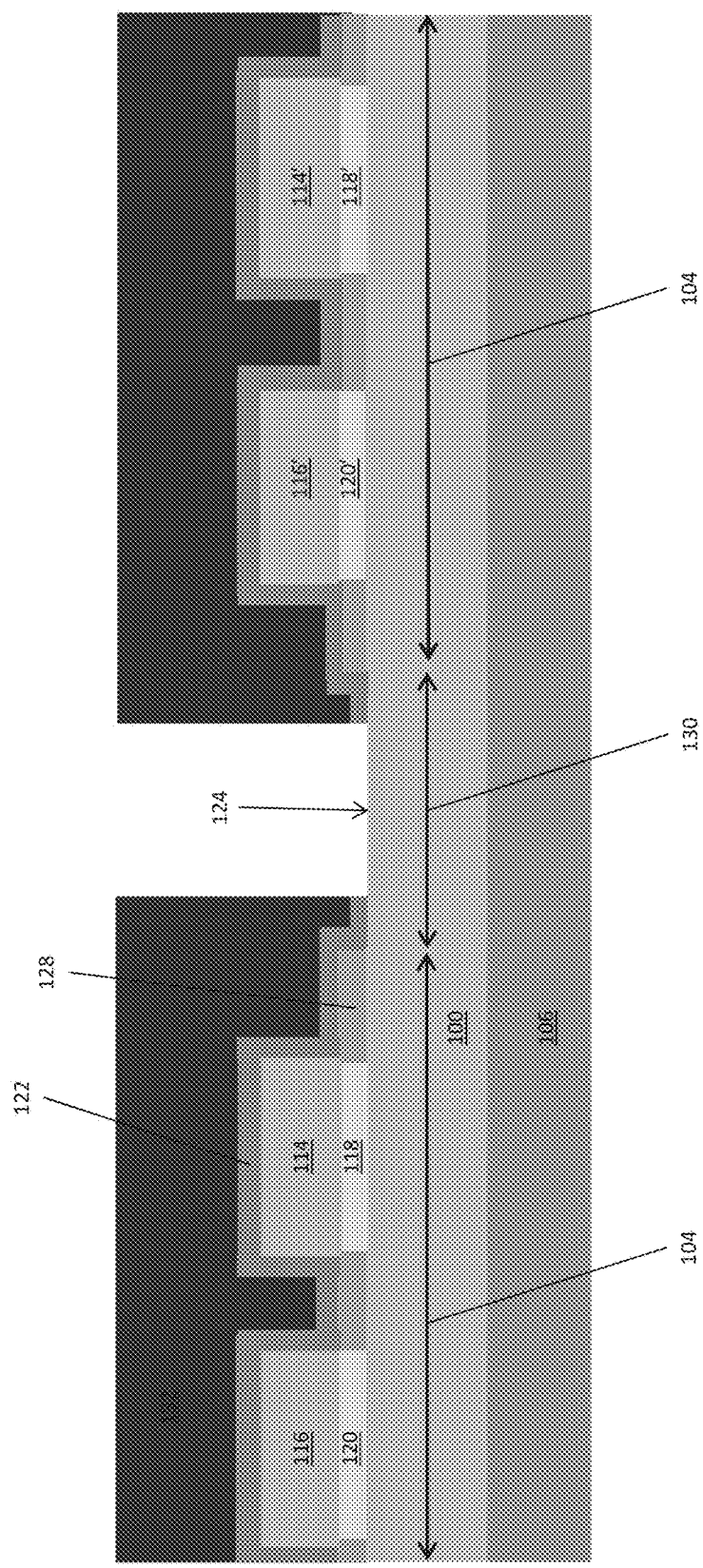

In FIG. 2C, the parts of the insulating layer 122 exposed by the openings 134 in the mask 132 are removed e.g. by wet chemical etching. The top main surface 124 of the III-V semiconductor body 100 is exposed in each region where the insulating layer 122 is removed.

Figure 2D:
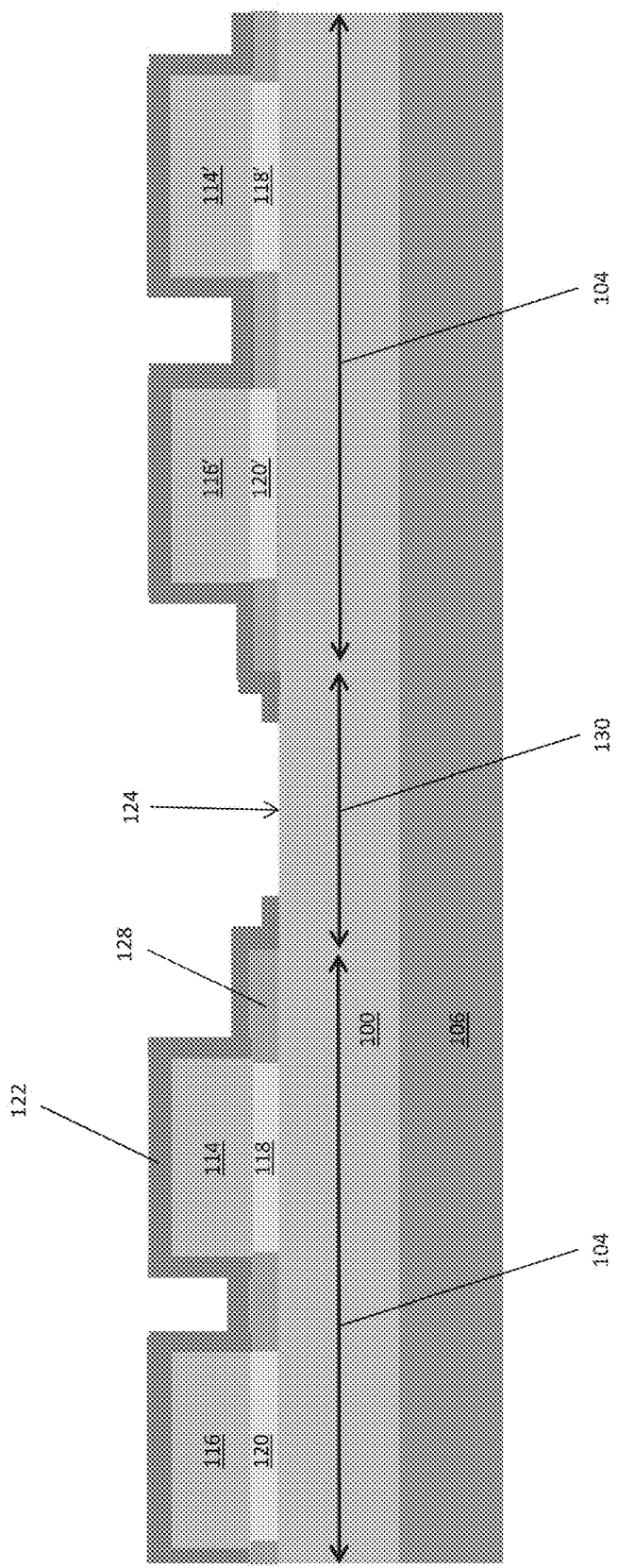

In FIG. 2D, the mask 132 is removed. In the case of a photoresist mask, the mask 132 can be removed by plasma ashing, chemical stripping, etc.

Figure 2E:
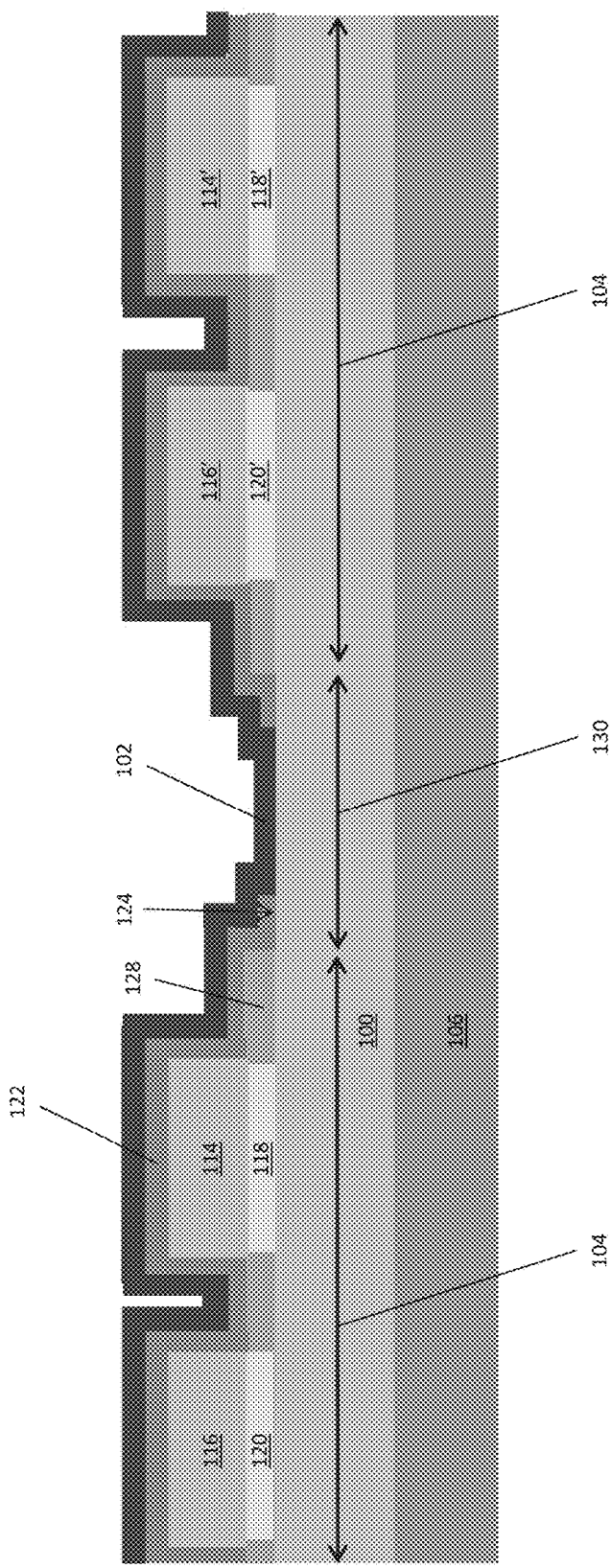

In FIG. 2E, the barrier 102 is formed on the insulating layer 122 and on the exposed top surface 124 of the III-V semiconductor body 100. In the case of a silicon nitride barrier, the barrier 102 can be formed by depositing by chemical vapor deposition a silane-ammonia mixture on the insulating layer 122 and on the exposed top surface 124 of the III-V semiconductor body 100. The flow rate of silane and ammonia is controlled during the chemical vapor deposition so that the silicon nitride layer formed by the chemical vapor deposition has a concentration of nitride sufficient to prevent water, water ions, sodium ions and potassium ions from diffusing through the resulting barrier 102. In the case of a silicon oxynitride barrier, the barrier 102 can be formed by by nitridation of a mixture of Si and silicon dioxide at a temperature above the melting point of silicon. A barrier 102 made of silicon nitride or silicon oxynitride can have a higher density of nitride than the surface passivation layer 128 of the III-V semiconductor body 100, which may be of poor quality (i.e. leaky) in some cases and therefore ineffective as a water/ion barrier.

Figure 2F:
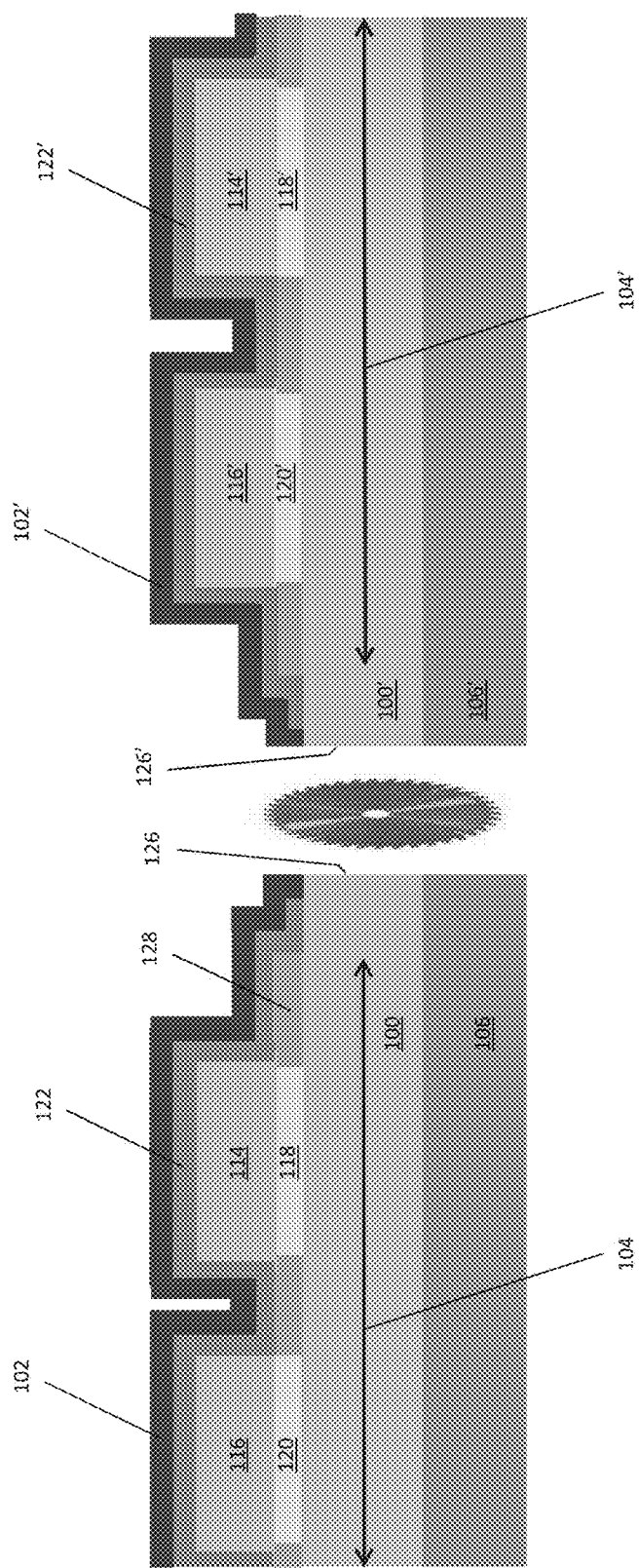

In FIG. 2F, the semiconductor dies are singulated. While a sawing process is shown in FIG. 2F, any standard singulation technique can be employed including laser dicing. The barrier 102 terminates the seal ring structure 108 and touches the top main surface 124 of the III-V semiconductor body 100, and the sidewall of the III-V semiconductor body 100 of each singulated die remains uncovered by the barrier 102. The barrier 102 covers the insulating layer 122 at the top main surface 124 of the III-V semiconductor body 100 so that the insulating layer 122 is not exposed at the main surface 124 of each semiconductor die after the dies are separated from one another along the singulation streets 130. This barrier configuration is most effective if the III-V semiconductor body 100 is potential free at the exposed sidewall 126 i.e. the singulation edge of each die as explained previously herein.

Figure 3:
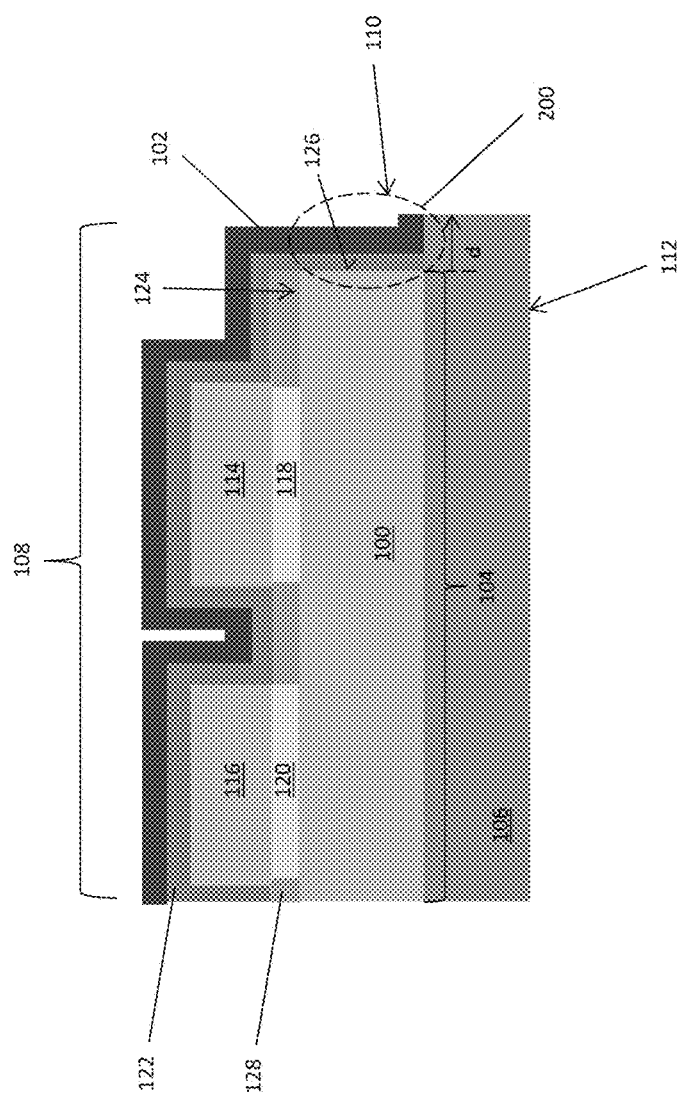
FIG. 3 illustrates a partial sectional view of another embodiment of an III-V semiconductor die having a barrier in the periphery of the die.

FIG. 3 illustrates a partial sectional view of another embodiment of an III-V semiconductor die having a barrier 102 in the periphery 104 of the III-V semiconductor body 100. The embodiment in FIG. 3 is similar to the embodiment in FIG. 1. Different, however, the insulating layer 122 extends along at least part of the edge face 110 of the semiconductor die. The barrier 102 covers the insulating layer 122 along the edge face 110 of the semiconductor die, so that the insulating layer 122 is not exposed along the edge face 110 of the die. In one embodiment, the semiconductor substrate 106 extends laterally (d) further than the periphery 104 of the III-V semiconductor body 100 so that a step 200 is formed between the III-V semiconductor body 100 and the substrate 106. The insulating layer 122 extends to and terminates at the step 200, and the barrier 102 extends onto the step 200 so that the insulating layer 122 is not exposed at the step 200. As such, the barrier 102 terminates the seal ring structure 108 by touching the semiconductor substrate 106. With this configuration, water and other ions to are blocked from diffusing through the insulating layer 122 inward beyond the seal ring structure 108 and therefore cannot reach the (inner) active region of the die. Additionally with this configuration, the singulation edge of the III-V semiconductor body 100 need not be completely compensated, because the sidewall 126 is protected by the barrier 102 against water/ion penetration. The insulating layer 122 can be omitted as previously explained herein.

FIGS. 4A through 4F illustrate partial sectional views of the III-V semiconductor die shown in FIG. 3 during different stages of an embodiment of manufacturing the seal ring structure 108 with the water/ion barrier 102.

Figure 4A:
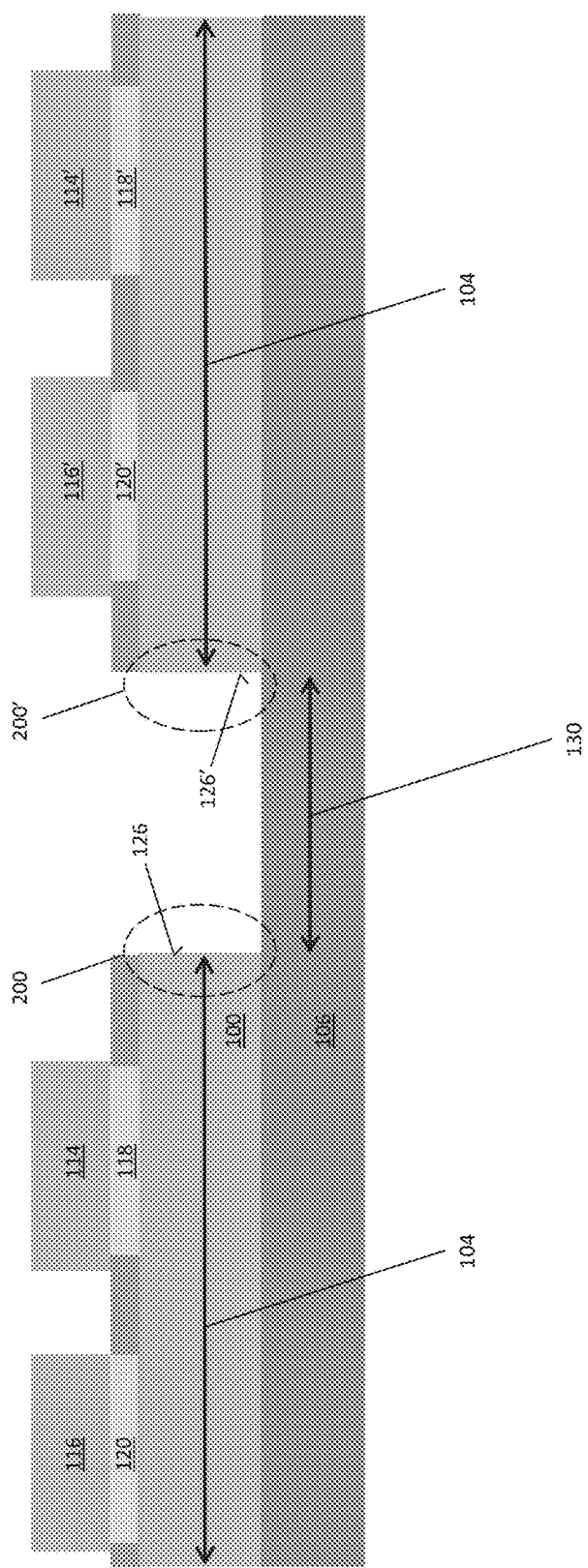
FIGS. 4A through 4F illustrate partial sectional views of the periphery of the III-V semiconductor die shown in FIG. 3 during different stages of an embodiment of manufacturing the seal ring structure with water/ion barrier.

In FIG. 4A, the III-V semiconductor body 100 is etched away between adjacent ones of the semiconductor dies to form a step 200 between the III-V semiconductor body 100 and the semiconductor substrate 106 of each semiconductor die. Any standard etching process can be used. The III-V semiconductor body 100 can be etched before or after the seal ring structure 108 is formed.

Figure 4B:
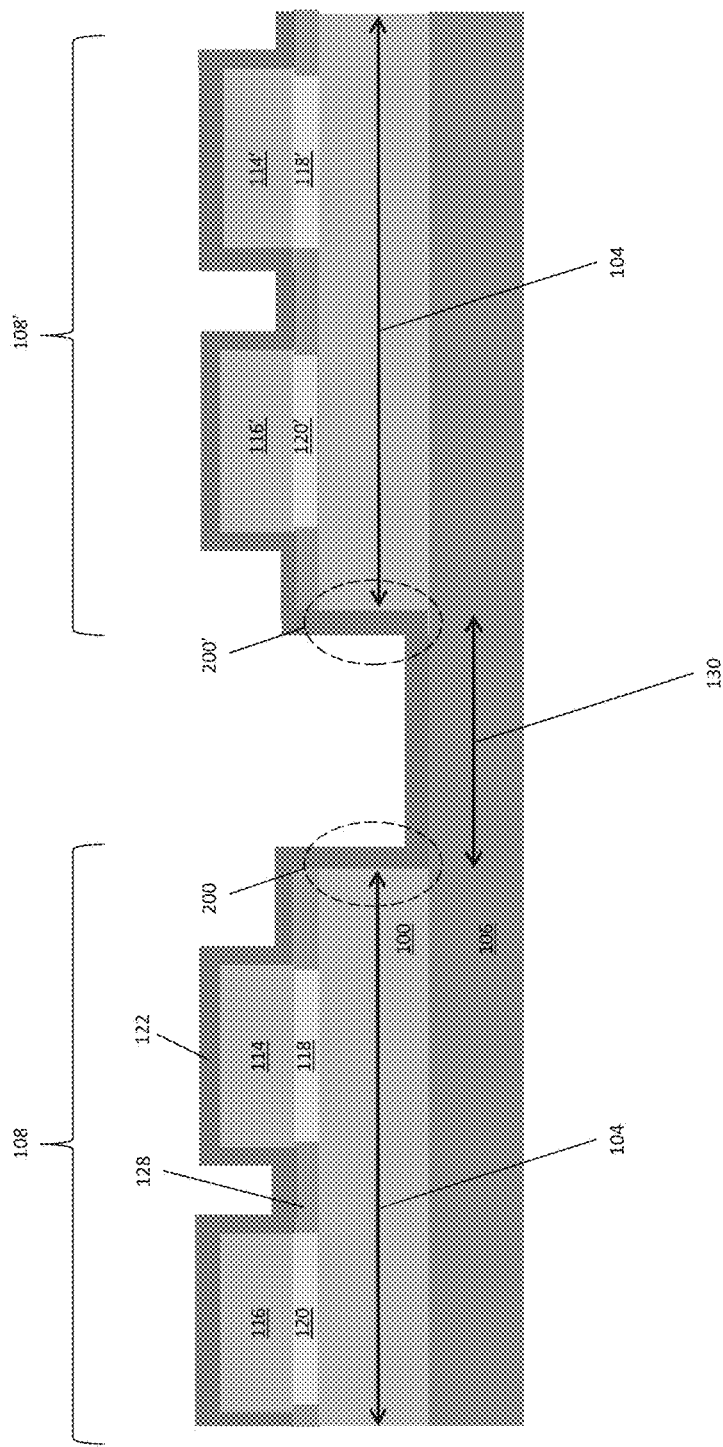

In FIG. 4B, the seal ring structure 108 is formed and the insulating layer 122 covers the seal ring structure 108 and the singulation streets 130 between adjacent ones of the semiconductor dies disposed on the same semiconductor substrate 106. Each singulation street 130 defines the region where two adjacent semiconductor dies are singulated as previously explained herein. According to this embodiment, the insulating layer 122 is deposited on the seal ring structure 108 and along the sidewall 126 of the III-V semiconductor body 100 of each semiconductor die formed by the previous etching process shown in FIG. 4A. The insulating layer 122 also extends onto the step 200 of each semiconductor die i.e. onto the semiconductor substrate 106. Alternatively, the insulating layer 122 can be omitted in the periphery 104 of the III-V semiconductor body 100, meaning that the barrier material will be later formed directly on the seal ring structure 108 and contact the sidewalls 126 of the III-V semiconductor body 100.

Figure 4C:
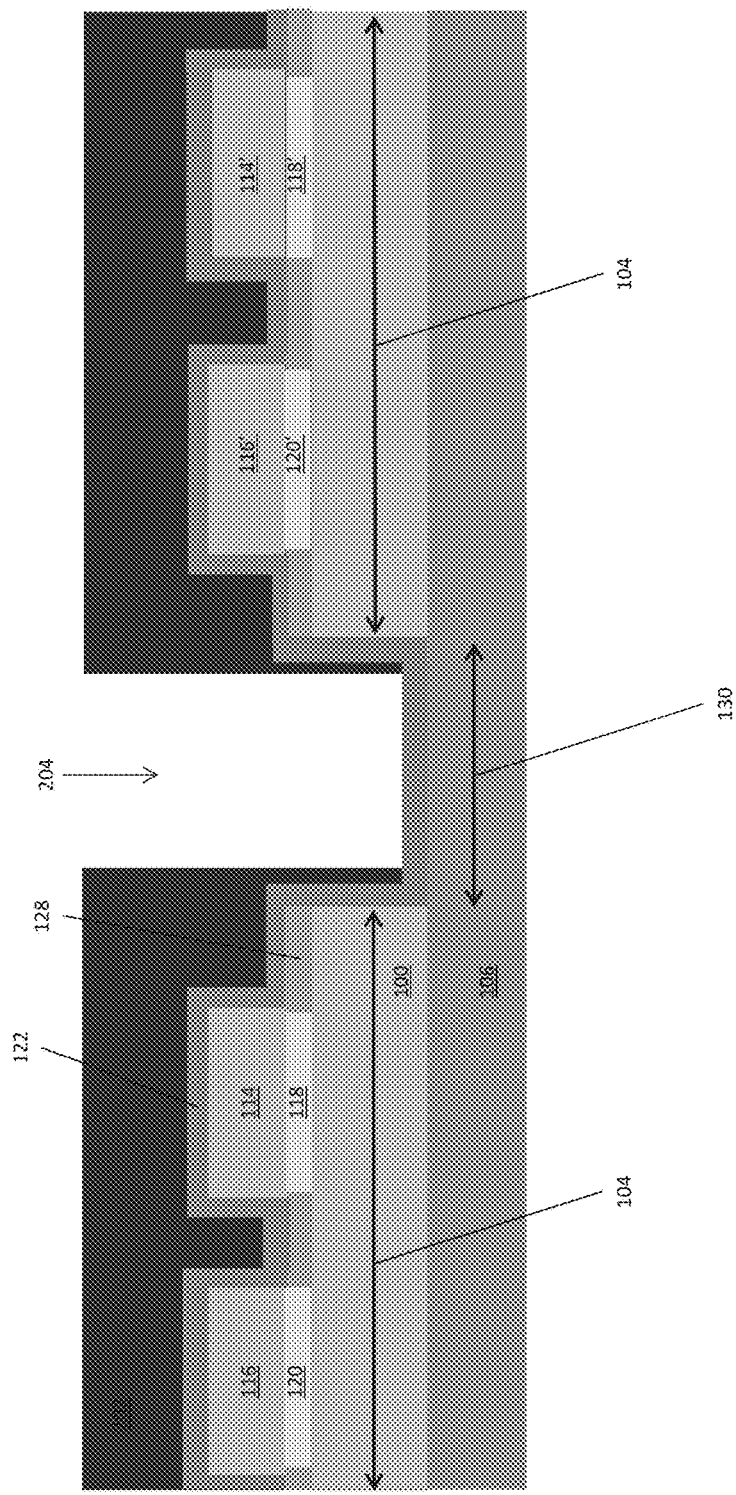

In FIG. 4C, a mask 202 e.g. made of photoresist is formed on the insulating layer 122. The mask 202 has openings 204 over the singulation streets 130. The openings 204 in the mask 202 expose parts of the insulating layer 122 over the singulation streets 130.

Figure 4D:
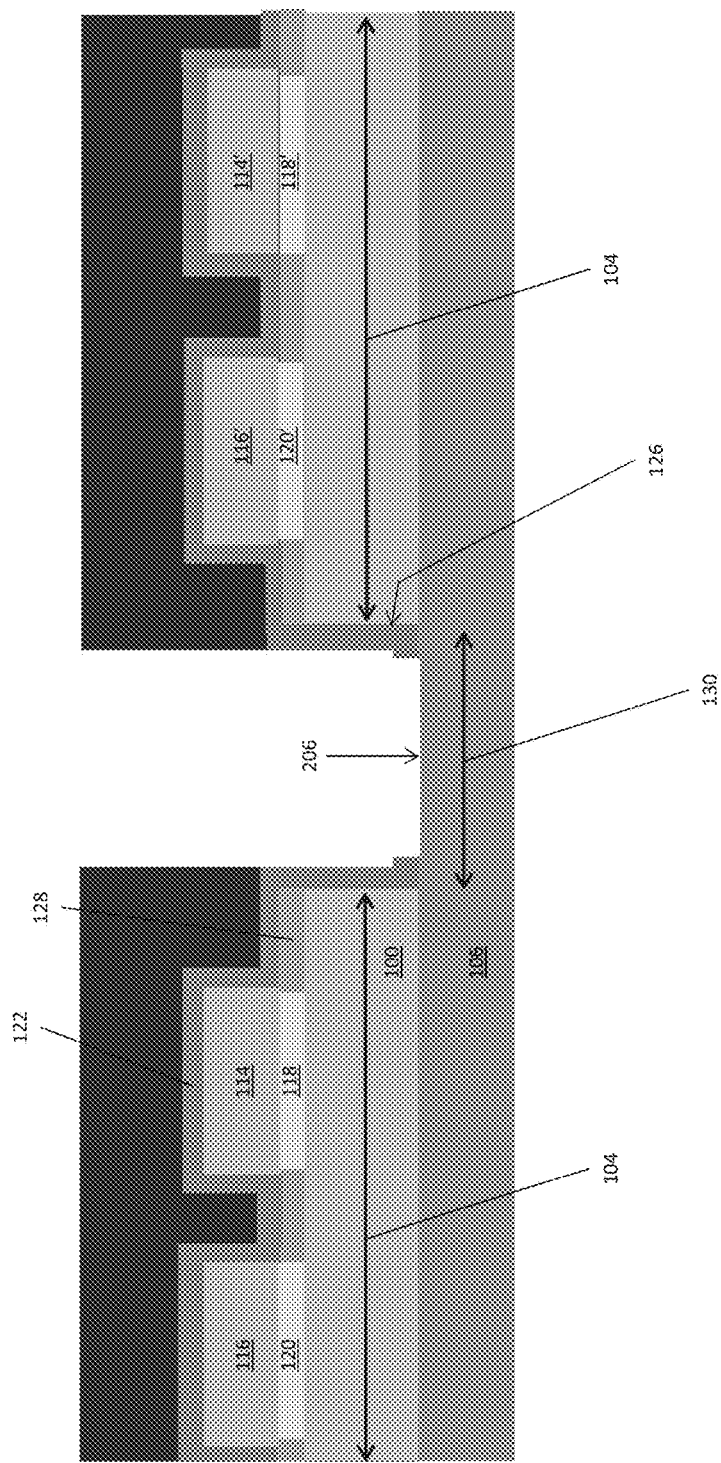

In FIG. 4D, the parts of the insulating layer 122 exposed by the openings 204 in the mask 202 are removed e.g. by wet chemical etching. The top main surface 206 of the semiconductor substrate 106 is exposed where the insulating layer 122 is removed. The insulating layer 122 also can be removed from opposing sidewalls 126 of the III-V semiconductor body 100 which face inward toward the respective sawing streets 130, since the sidewalls 126 will be later covered by the barrier material according to this embodiment.

Figure 4E:
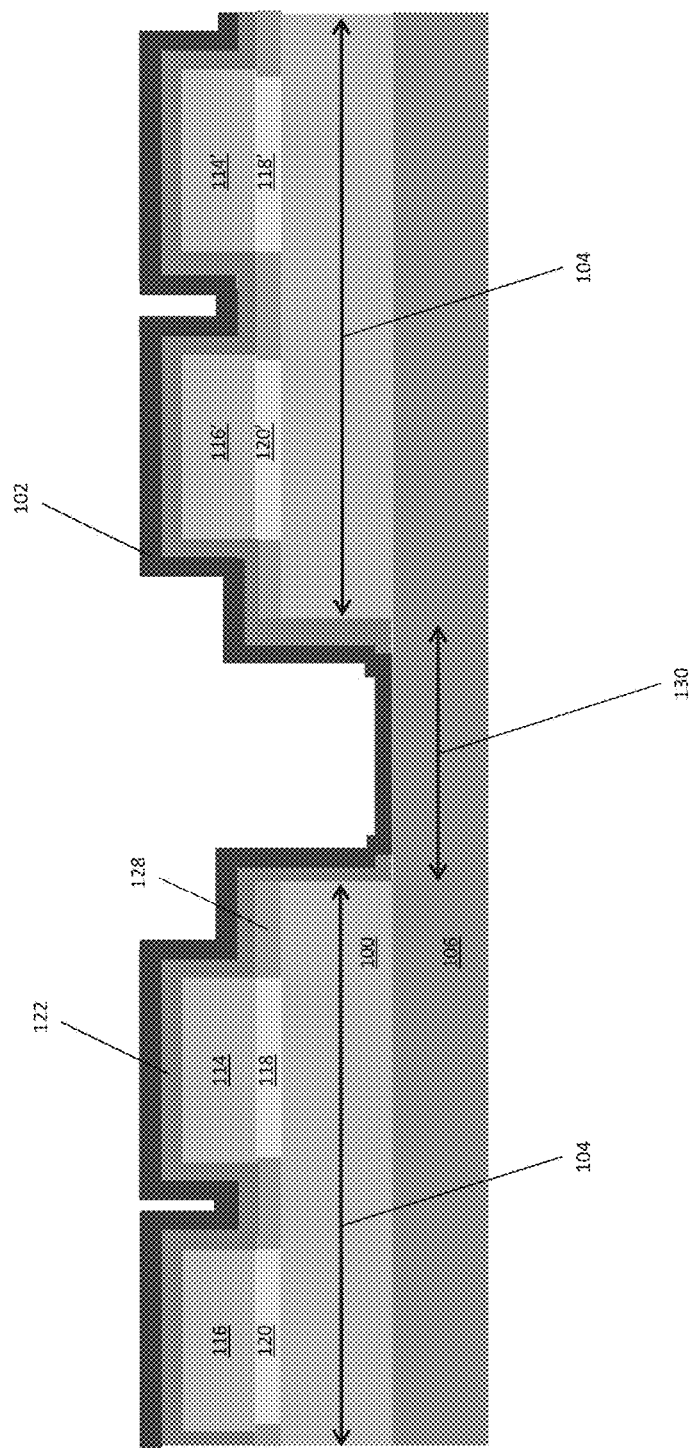

In FIG. 4E, the mask 202 is removed and the barrier 102 is formed on the insulating layer 122 and on the exposed top surface 206 of the semiconductor substrate 106 e.g. as previously described herein.

Figure 4F:
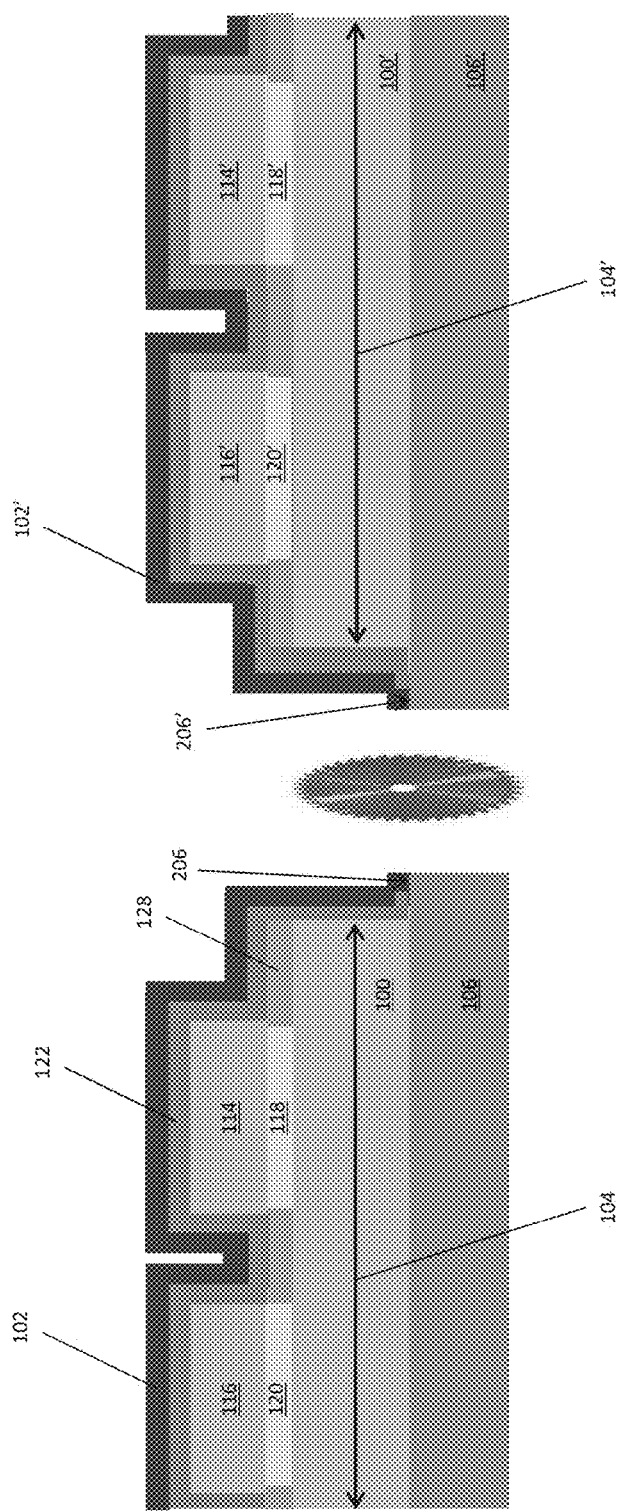

In FIG. 4F, the semiconductor dies are singulated. While a sawing process is shown in FIG. 4F, any standard singulation technique can be employed as previously described herein. The barrier 102 terminates the seal ring structure 108 and touches the top main surface 206 of the semiconductor substrate 106. As such, the barrier 102 covers the sidewall 126 of the III-V semiconductor body 100 of each singulated die and covers the insulating layer 122 at the top main surface 206 of the semiconductor substrate 106. This way, the insulating layer 122 is not exposed at the step 200 of each semiconductor die after the dies are separated from one another along the singulation streets 130. This barrier configuration is well suited in the case of the III-V semiconductor body 100 not necessarily being potential free at the exposed sidewall 126 i.e. the singulation edge of each die as explained previously herein.

The sidewall 126 of the III-V semiconductor body 100 of each semiconductor die formed by the etching process shown in FIG. 4A are illustrated as vertical sidewalls, but in reality have some slope (angle).

Figure 5:
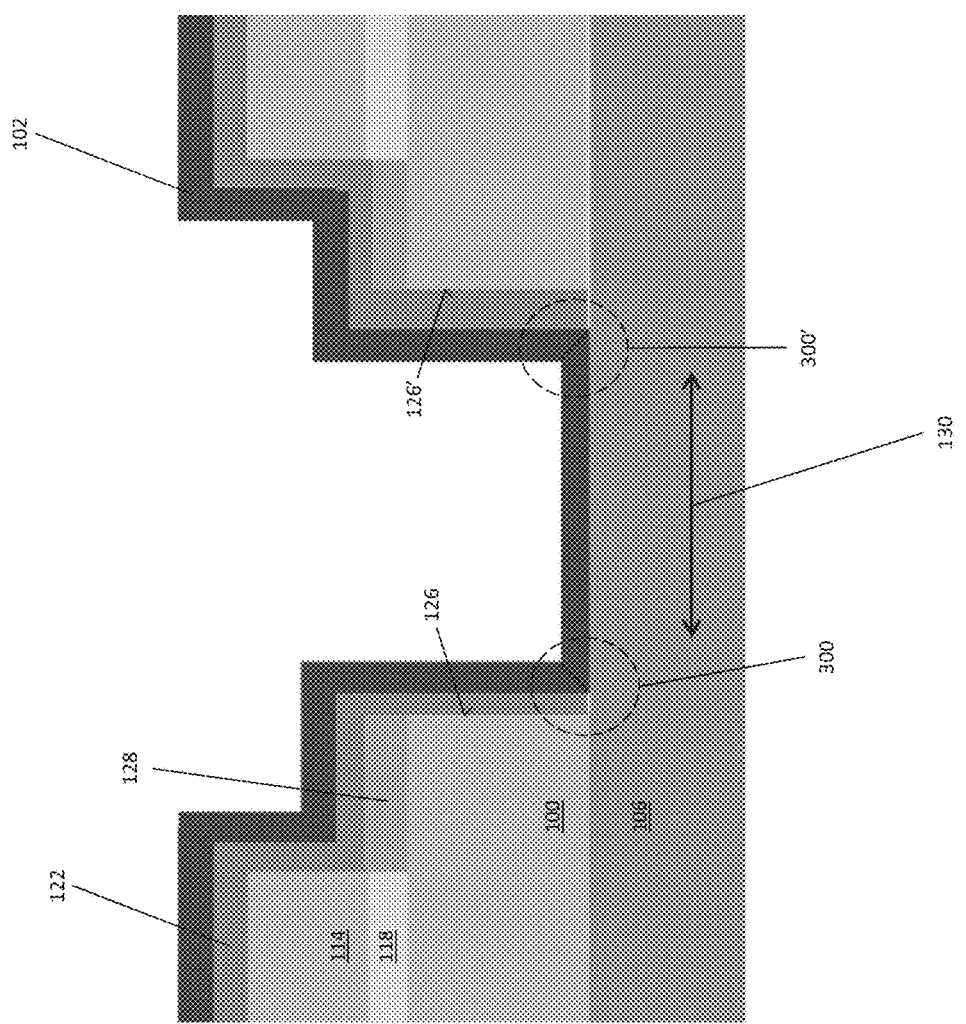
FIG. 5 illustrates an exploded view of two adjacent semiconductor dies in the vicinity of the sawing street shown in FIGS. 4A through 4F, after the seal ring structure and barrier are formed but prior to singulation.

FIG. 5 is an exploded view of two adjacent semiconductor dies in the vicinity of a sawing street 130, after the seal ring structure 108 and the barrier 102 are formed but prior to die singulation. A vertical sidewall construction can cause a seamline to arise in the barrier 102 at a corner region 300 of each sidewall 126 as shown in FIG. 5. The seamlines are shows as dashed slanted lines. Standard processes for forming a barrier 102 comprising silicon oxynitride and/or silicon nitride can have two 'growing' fronts which meet at the corner region 300 of each sidewall 126 in the case of vertical sidewalls 126. The barrier material growing along one front abuts the barrier material growing along the front at the corner region 300 of each sidewall 126. This results in a seamline which can allow water and other ions to penetrate through the barrier 102. The dimensions of the seamline can be reduced or the seamline can be eliminated altogether by etching the III-V semiconductor body 100 so that the resulting sidewalls 126 are sloped or curved.

Figure 6:
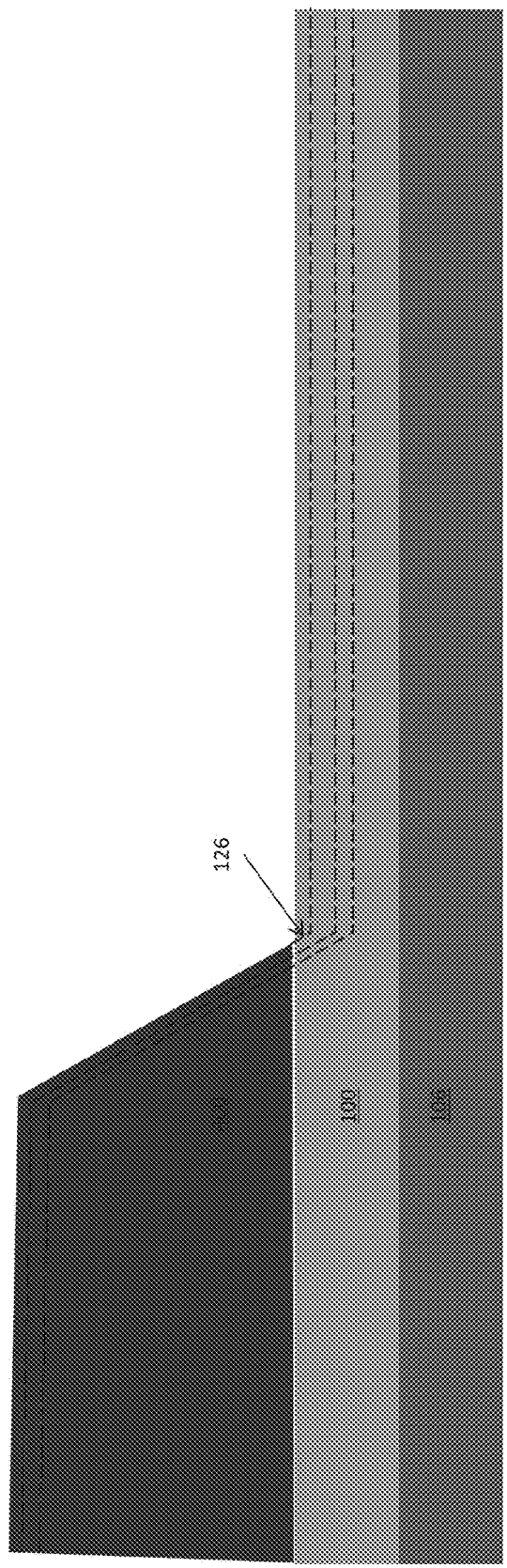
FIG. 6 illustrates an embodiment of an anisotropic etch process used to etch the III-V semiconductor body of the semiconductor die shown in FIG. 3.

FIG. 6 illustrates an embodiment of an anisotropic etch process in which the etch mask 400 is partly removed during the etching process. A sidewall etched in the underlying III-V semiconductor body 100 is sloped according to this embodiment, so that the III-V semiconductor body 100 has a sloped sidewall 126 at the edge face of the semiconductor die after the etching process is complete. The dashed lines in FIG. 6 indicate the amount of mask and III-V semiconductor body removal that occurs at different points in the etching process. Since the etch mask 400 has a sloped/angled profile and is partly etched during the process, the sidewall 126 of the underlying III-V semiconductor body 100 takes on a similar sloped/angled shape.

Figure 7:
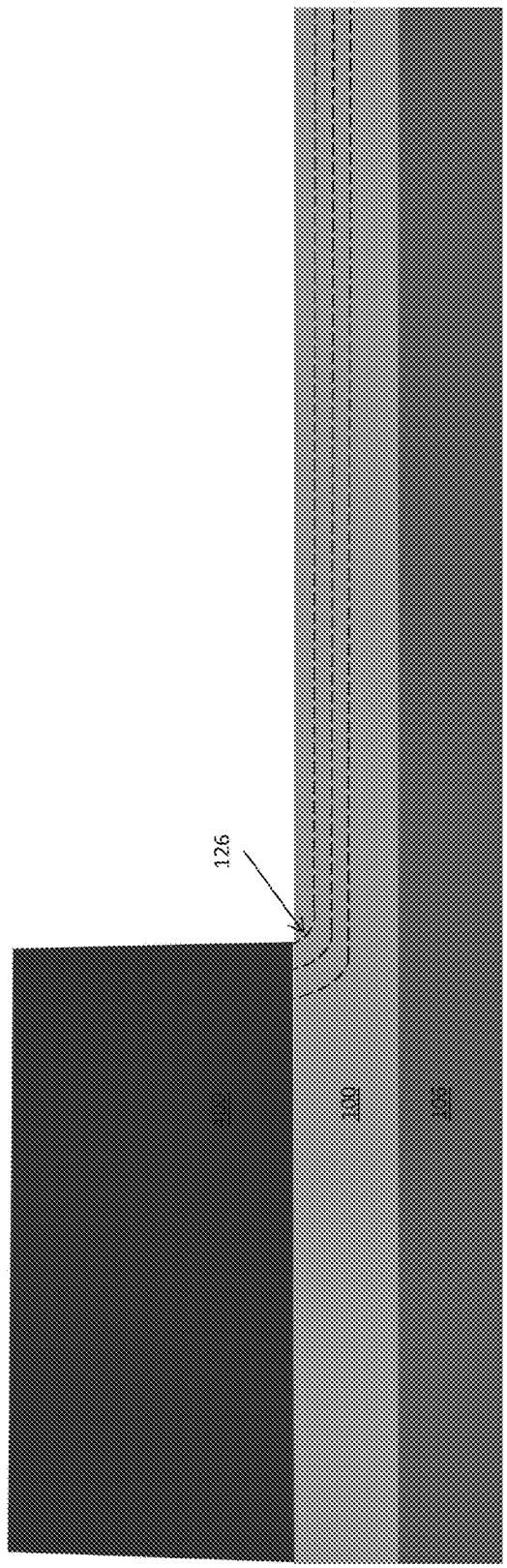
FIG. 7 illustrates an embodiment of an isotropic etch process used to etch the III-V semiconductor body of the semiconductor die shown in FIG. 3.

FIG. 7 illustrates an embodiment of an isotropic etch process in which the III-V semiconductor body 100 under the mask 400 is etched in both the lateral and vertical directions. The dashed lines in FIG. 7 indicate the amount of III-V semiconductor body removal that occurs at different points in the etching process. Since an isotropic etch such as hot phosphorous wet chemical etching is employed, the sidewall 126 of the underlying III-V semiconductor body 100 takes on a curved shape.

Figure 8:
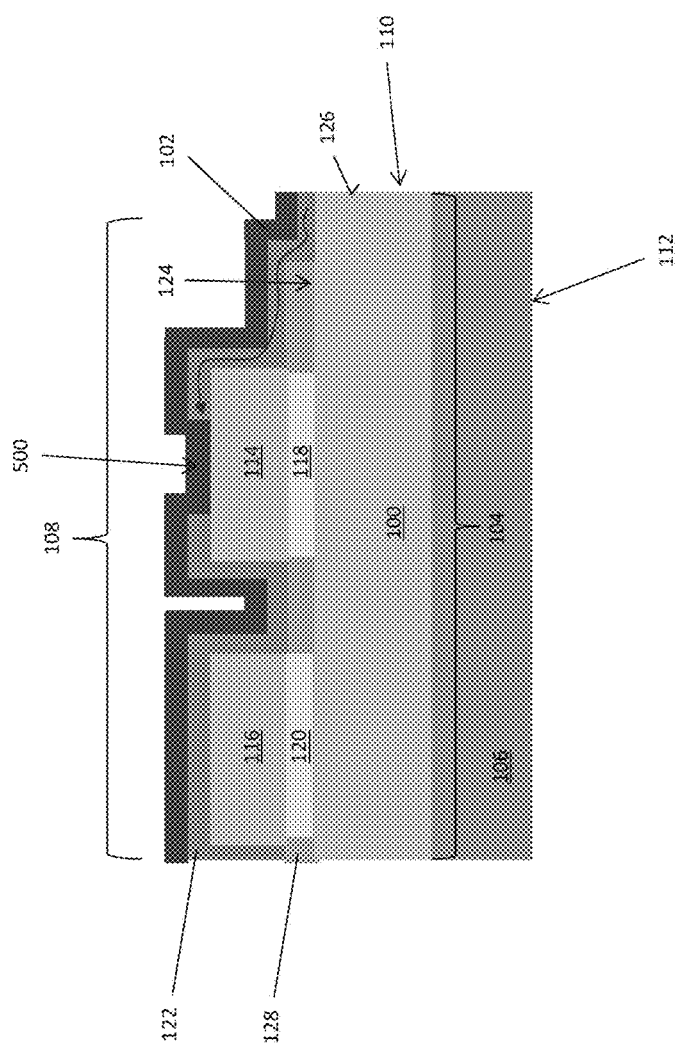
FIG. 8 illustrates a partial sectional view of an embodiment of an III-V semiconductor die having a barrier in the periphery of the die, the barrier contacting the seal ring structure.

FIG. 8 illustrates a partial sectional view of yet another embodiment of an III-V semiconductor die having a barrier 102 in the periphery 104 of the III-V semiconductor body 100. The barrier 102 can be formed in accordance with any of the embodiments previously described. That is, the barrier 102 can cover the insulating layer 122 at the top main surface 124 of the III-V semiconductor body 100 so that the insulating layer 122 is not exposed at the top main surface 124 of each semiconductor die after the dies are separated from one another e.g. as shown in FIGS. 1 and 2F. Alternatively, the barrier 102 can cover the sidewall 126 of the III-V semiconductor body 100 of each singulated die and cover the insulating layer 122 at the top main surface 206 of the semiconductor substrate 100 e.g. as shown in FIGS. 3 and 4F. In the latter case, the III-V semiconductor body 100 can have vertical, sloped or curved sidewalls 126.

In FIG. 8, the barrier 102 does not cover the insulating layer 122 at the edge face 110 of the semiconductor die to emphasize that humidity can enter through the exposed part of the insulating layer 122 as indicated by the squiggly line. However, the barrier 102 can cover the insulating layer 122 so that the insulating layer 122 is not exposed at the edge face 110 of the semiconductor die as previously described herein.

Even if the barrier 102 were constructed as shown in FIG. 8, the configuration of the periphery of the die can be modified to block water, water ions, sodium ions and potassium ions from diffusing through the insulating layer 122 inward beyond the seal ring structure 100. According to the embodiment shown in FIG. 8, the insulating layer 122 has an opening 500 through which the barrier 102 contacts the top surface of the seal ring structure 108 i.e. the surface of the seal ring structure 108 facing away from the III-V semiconductor body 100. With such a configuration, water, water ions, sodium ions and potassium ions which enter the insulating layer 122 at the edge face 110 of the die cannot diffuse inward beyond the seal ring structure 108. The barrier 102 and the outer metal ring 114 of the seal ring structure 108 block such lateral diffusion according to this embodiment. Each metal ring 114, 116 and optional contact metal 118, 120 of the seal ring structure 108 also act as a vertical barrier against the diffusion of water, water ions, sodium ions and potassium ions.

Figure 9:
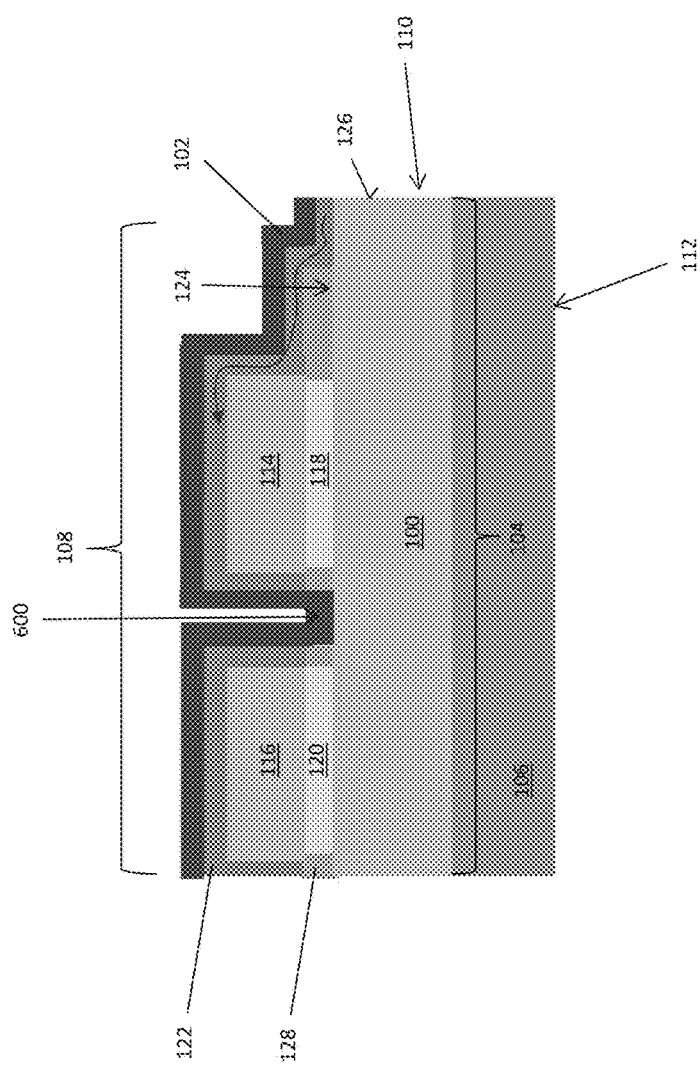
FIG. 9 illustrates a partial sectional view of an embodiment of an III-V semiconductor die having a barrier in the periphery of the die, the barrier contacting the III-V semiconductor body between adjacent metal rings of the seal ring structure.

FIG. 9 illustrates a partial sectional view of an alternate embodiment of the III-V semiconductor die, in which the seal ring structure 108 comprises the first metal ring 114 and the second metal ring 116 spaced inward from the first metal ring 114, and the insulating layer 112 has an opening 600 between the metal rings 114, 116. The barrier 102 contacts the top main surface 124 of the III-V semiconductor body 100 through the opening 600 in the insulating layer 122 between the first and second metal rings 114, 116.

Figure 10:
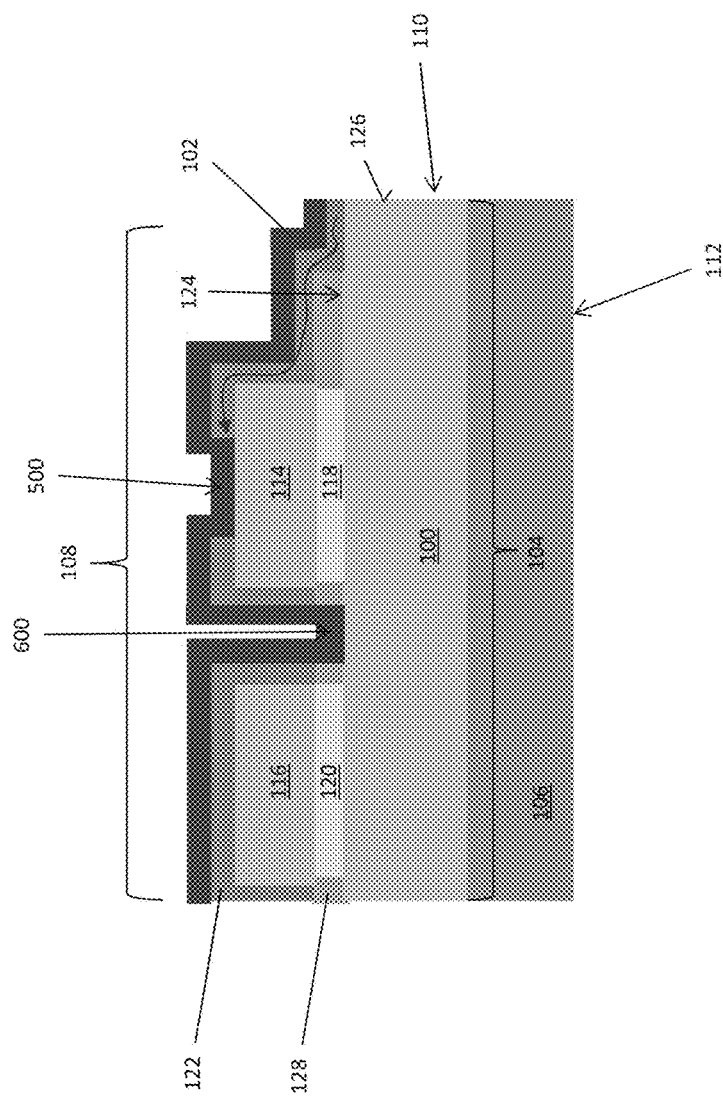
FIG. 10 illustrates a partial sectional view of an embodiment of an III-V semiconductor die having a barrier in the periphery of the die, the barrier contacting the seal ring structure and the III-V semiconductor body between the adjacent metal rings of the seal ring structure.

FIG. 10 illustrates a partial sectional view of a combination of the embodiments shown in FIGS. 8 and 9. According to this embodiment, the barrier 102 contacts the top main surface 124 of the III-V semiconductor body 100 through a first opening 600 in the insulating layer 122 between the first and second metal rings 114, 116 of the seal ring structure 108. The insulating layer 122 also has an additional opening 500 through which the barrier 102 contacts the top surface of at least one of the first and second metal rings 114, 116 of the seal ring structure 108 to form a double-diffusion barrier.

As previously described herein, the insulating layer 122 can be omitted in the periphery 104 of the III-V semiconductor body 100, meaning that the barrier 102 is disposed directly on the seal ring structure 108.

Figure 11:
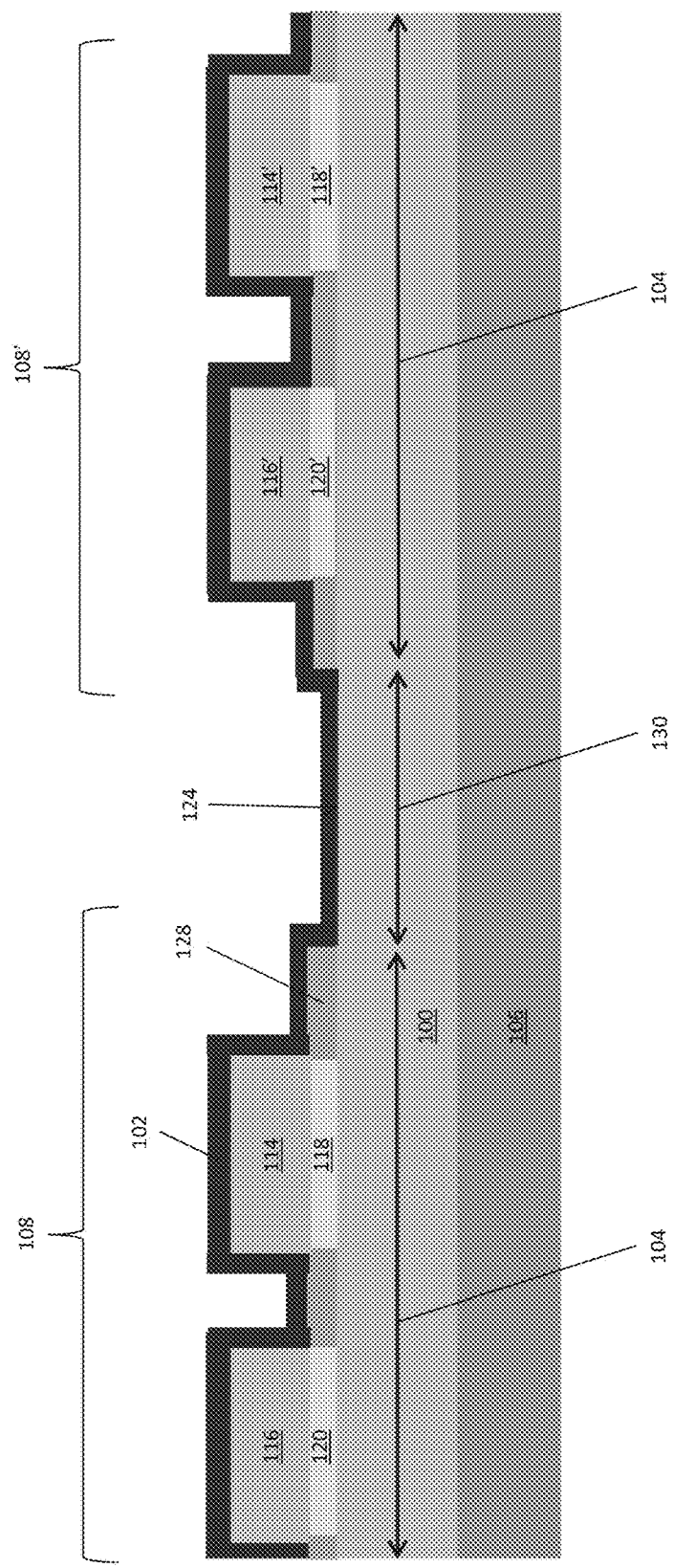
FIG. 11 illustrates a partial sectional view of the periphery of an III-V semiconductor body during formation of a water/ion barrier.

FIG. 11 illustrates an alternative of the method shown in FIGS. 2A through 2F, in which the insulating layer 122 is removed from the periphery 104 of the III-V semiconductor body 100 and the barrier 102 is formed directly on the seal ring structure 108. For example, after the insulating layer 122 is formed on the entire III-V semiconductor body 100, the active area of each die (out of view) can be protected by a mask and the insulating layer 122 removed from the unmasked periphery 104 of each die. The barrier material 108 is then deposited directly on the seal ring structure 108 and the sawing streets 130.

Figure 12:
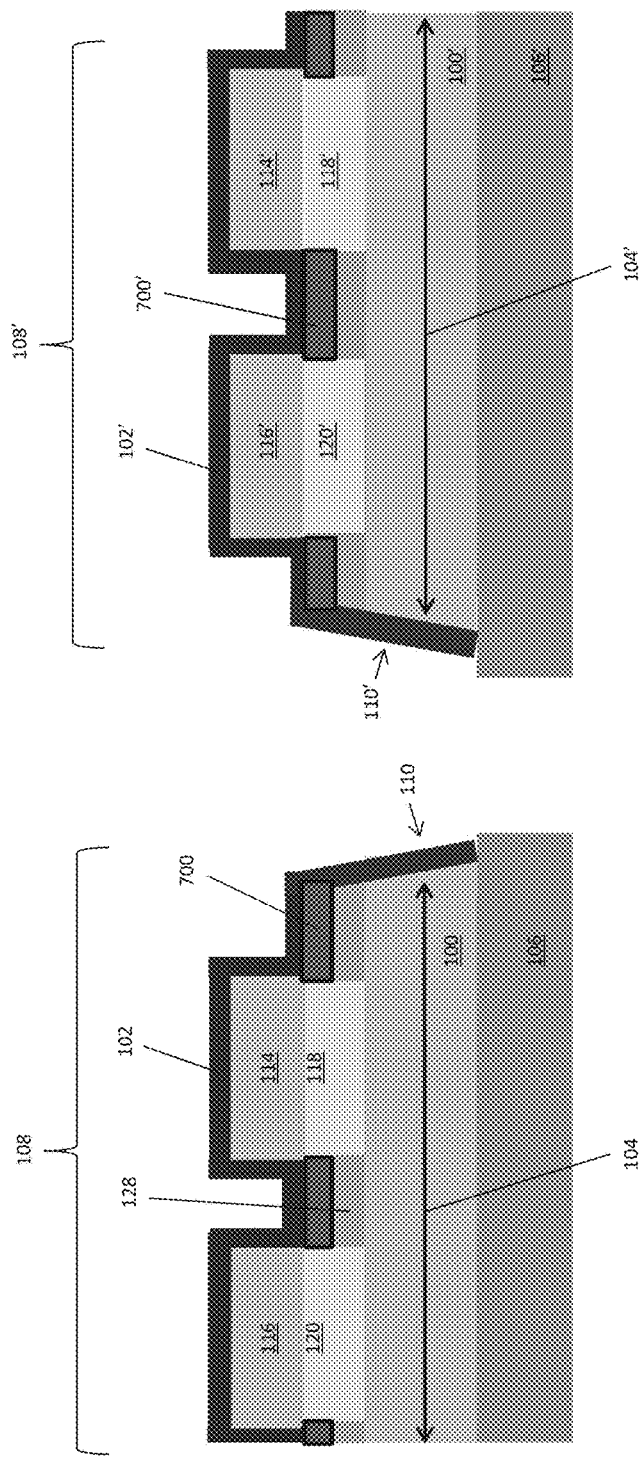
FIG. 12 illustrates a partial sectional view of an embodiment of an III-V semiconductor die having two barriers in the periphery of the die.

FIG. 12 illustrates a partial sectional view of an embodiment of III-V semiconductor dies each having two barriers 102, 700 in the periphery 104 of the III-V semiconductor body 100. The additional barrier 700 is effective against diffusion of water, water ions, sodium ions and potassium ions, e.g. such as silicon oxynitride and/or silicon nitride. The additional barrier 700 is formed below the upper barrier 102 between adjacent rings 114, 116 of the seal ring structure 108 and between the outermost ring 114 and the edge face 110 of each semiconductor die. This way, even if a seam line is present in the upper barrier 102, the lower barrier 700 in conjunction with each metal ring 114, 116 of the seal ring structure 108 block water, water ions, sodium ions and potassium ions from diffusing inward beyond the seal ring structure 108.

FIGS. 13A through 13F illustrate partial sectional views of the III-V semiconductor body 100 shown in FIG. 12 during different stages of an embodiment of manufacturing the seal ring structure 108 with the dual water/icon barrier 102/700.

Figure 13A:
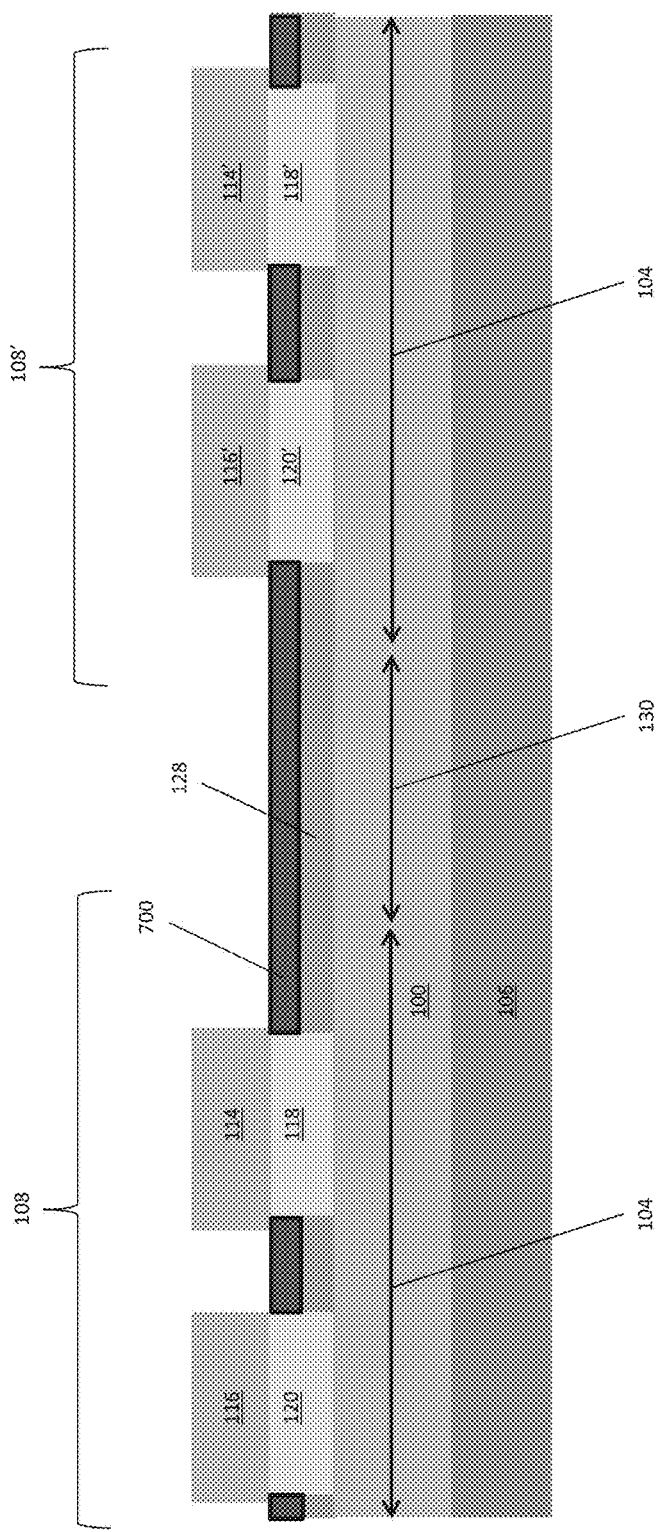
FIGS. 13A through 13F illustrate partial sectional views of the periphery of the III-V semiconductor die shown in FIG. 12 during different stages of an embodiment of manufacturing the seal ring structure with water/ion barrier.

In FIG. 13A, the seal ring structure 108 has been formed and the lower barrier 700 comprising e.g. silicon oxynitride and/or silicon nitride is formed between adjacent rings 114, 116 of the seal ring structure 108 and over the sawing streets 130 between adjacent dies. The lower barrier 700 is effective at blocking water, water ions, sodium ions and potassium ions from diffusing inward beyond the seal ring structure 108 even if seam lines are present in the upper barrier to be formed later.

Figure 13B:
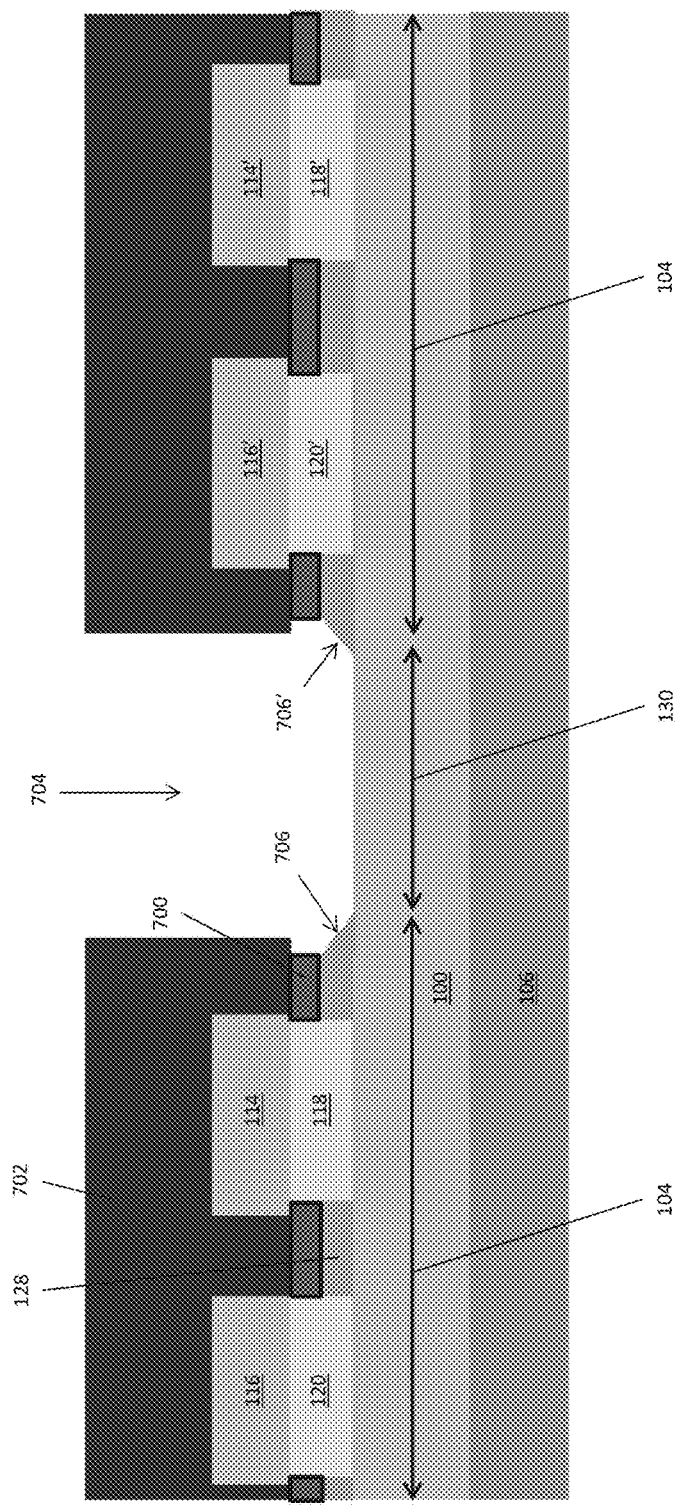

In FIG. 13B, a first mask 702 is formed over the periphery 104 of the semiconductor dies and patterned to expose the lower barrier 700 through openings 704 in the mask 702. The lower barrier 700 and the passivation layer 128 applied to the top main surface 124 of the III-V semiconductor body 100 are etched through the openings 704 in the first mask 702. The passivation layer 128 applied to the top main surface 124 of the III-V semiconductor body 100 can be etched so as to have slanted edges 706.

Figure 13C:
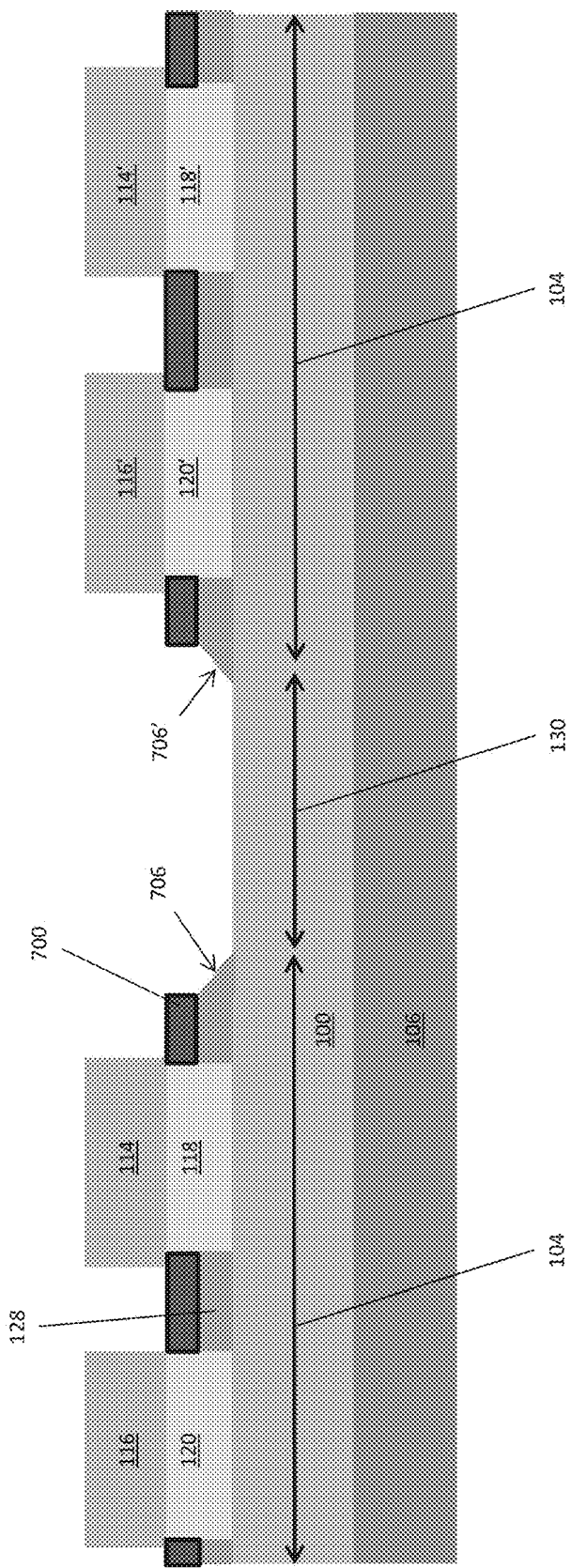

In FIG. 13C, the first mask 702 is removed.

Figure 13D:
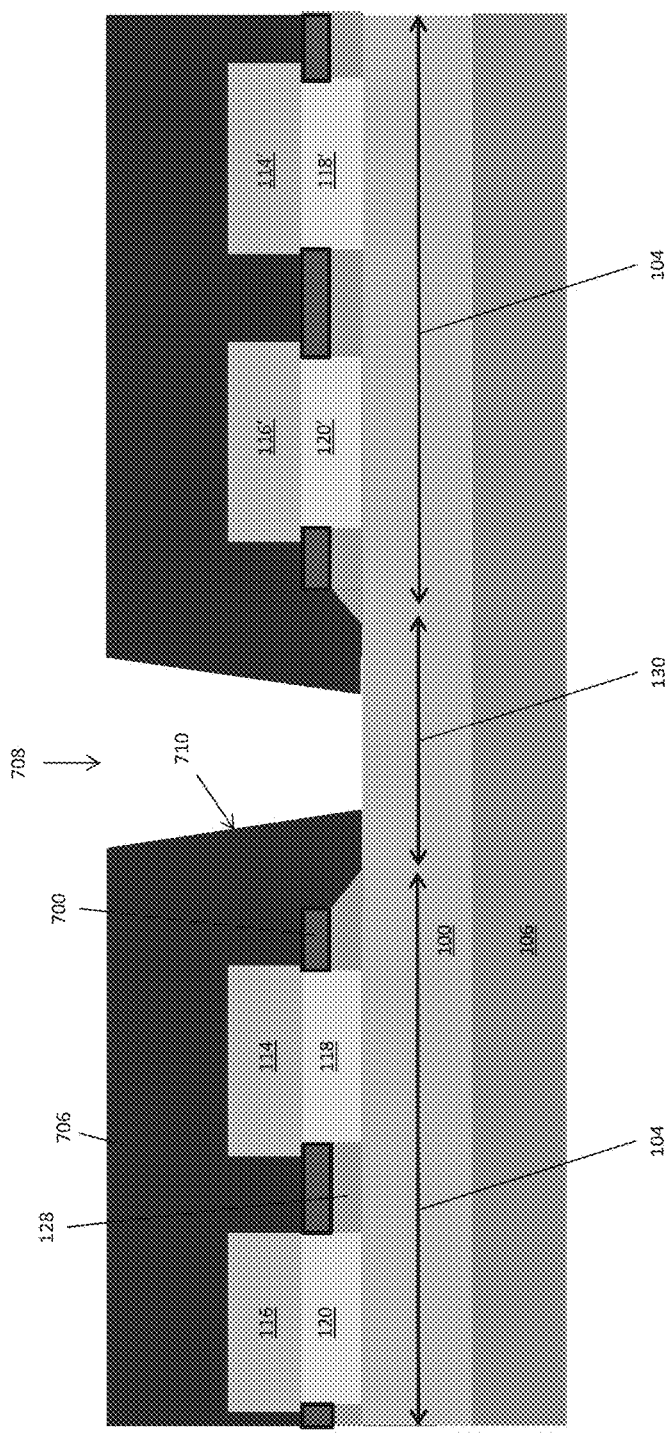

In FIG. 13D, a second mask 706 is formed over the periphery 104 of each semiconductor die and patterned to expose the III-V semiconductor body 100 in the sawing streets 130 through openings 708 in the second mask 706. The openings 708 in the second mask 706 have slanted sidewalls 710.

Figure 13E:
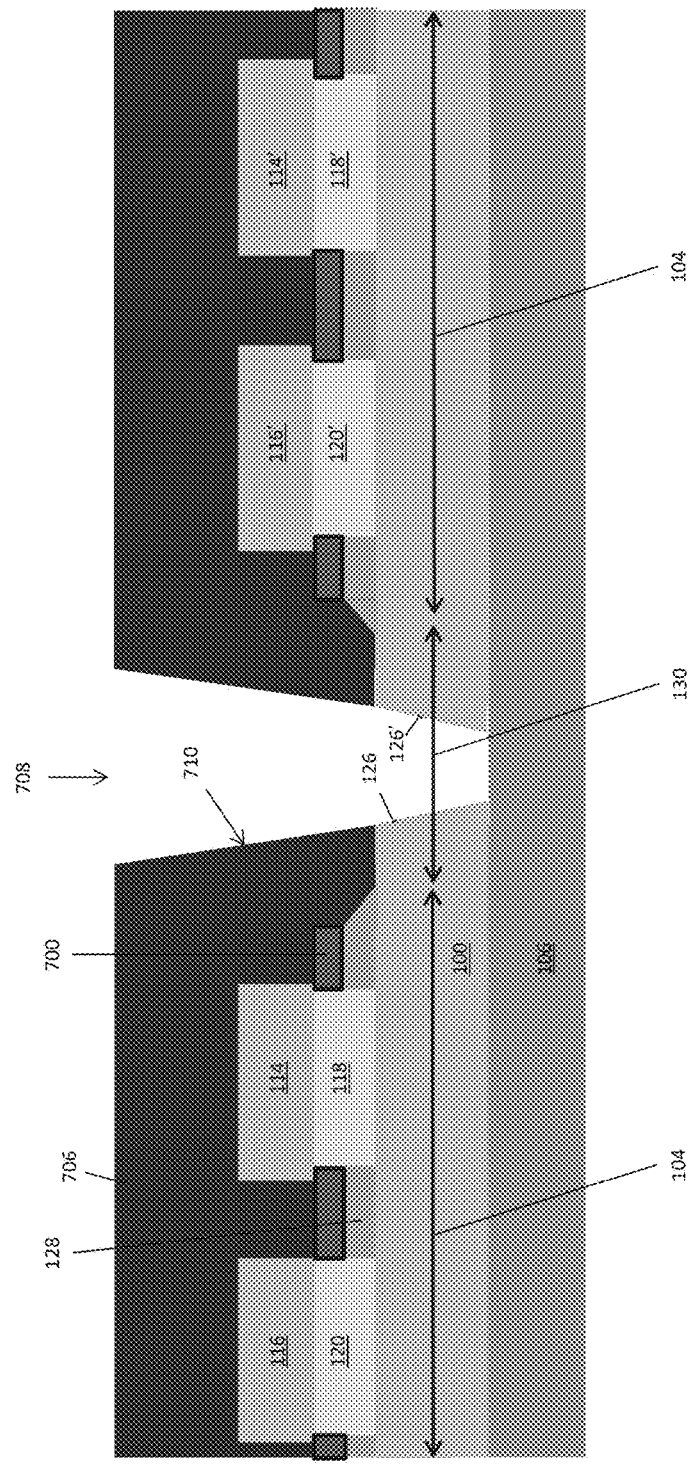

In FIG. 13E, the exposed part of the III-V semiconductor body 100 is etched through the openings 708 in the second mask 706. The resulting sidewalls 126 of the III-V semiconductor body 100 are slanted due to the angled sidewalls 710 of the openings 708 in the second mask 706.

Figure 13F:
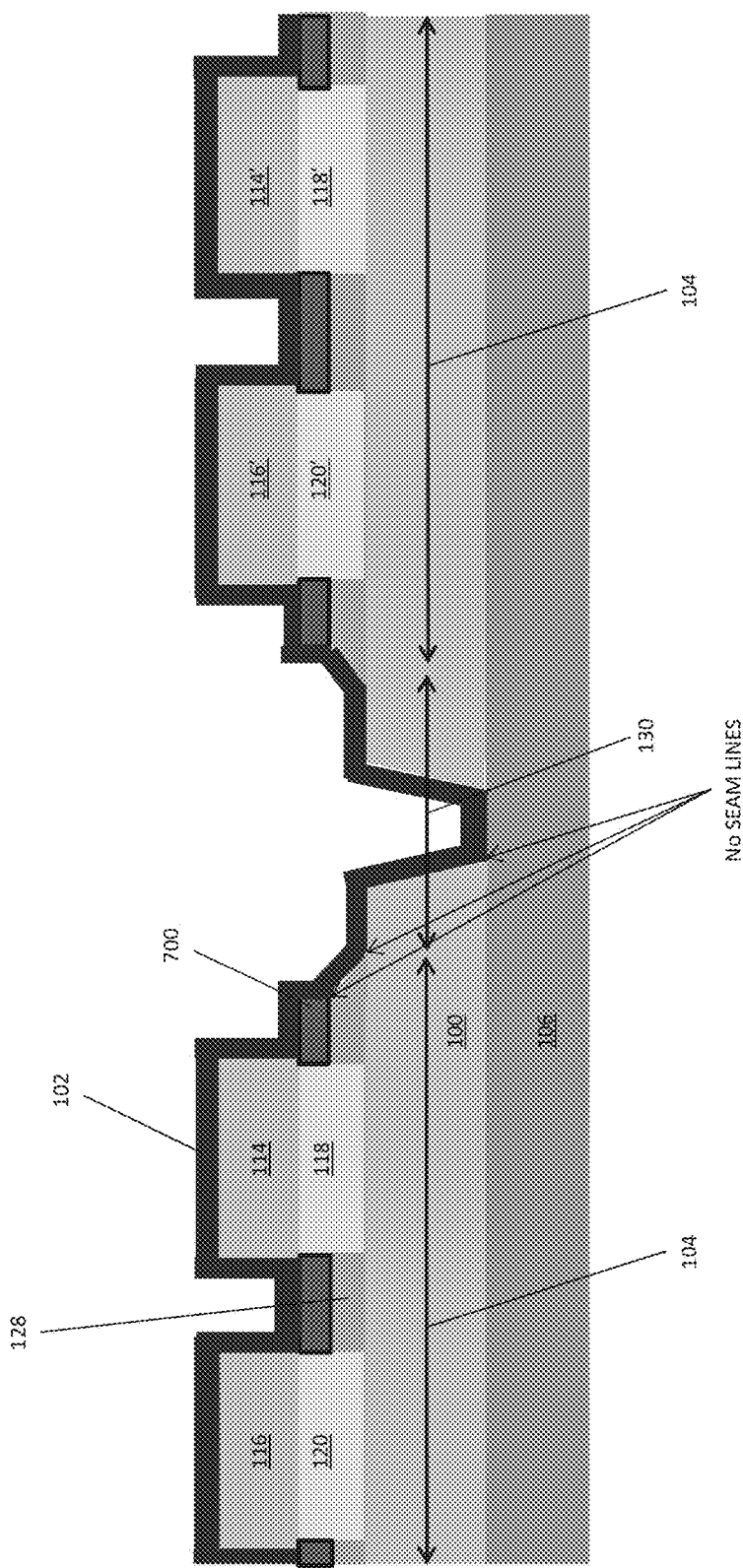

In FIG. 13F, the upper barrier 102 is formed over the periphery of each III-V semiconductor die. The upper barrier 102 has no seamlines along the sidewalls 706 of the passivation layer 128 applied to the top main surface 124 of the III-V semiconductor body 100 or along the sidewalls 126 of the III-V semiconductor body 100, due to the angled sidewalls 706, 126 of the passivation layer 128 and of the III-V semiconductor body 100. The lower barrier 700 protects against any seamlines present in the upper barrier 102 along the sidewalls of the seal ring structure 108.

Figure 14:
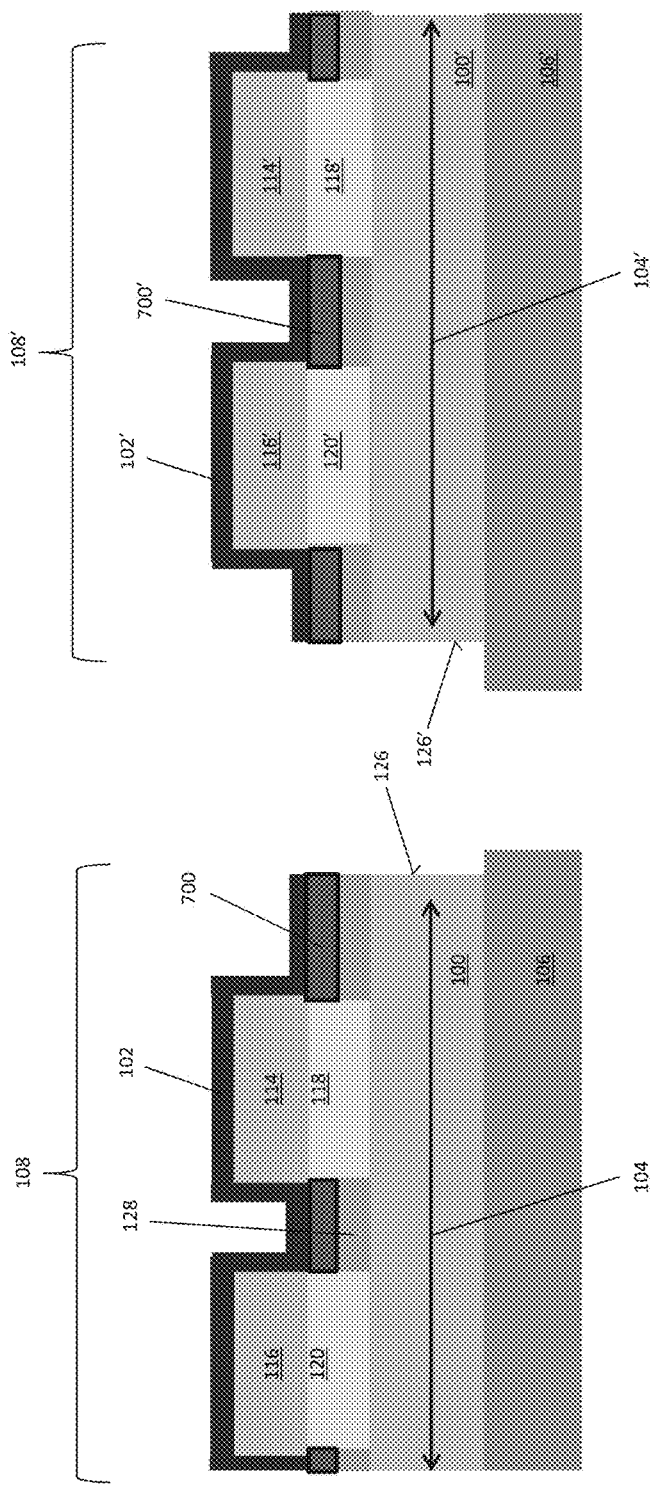
FIG. 14 illustrates a partial sectional view of another embodiment of an III-V semiconductor die having two barriers in the periphery of the die.

FIG. 14 illustrates a partial sectional view of yet another embodiment of III-V semiconductor dies each having dual barriers 102, 700 in the periphery 104 of the III-V semiconductor body 100. The embodiment shown in FIG. 14 is similar to the embodiment shown in FIG. 12. Different, however, the sidewall 126 of the III-V semiconductor body 100 of each semiconductor die remains uncovered by any diffusion barrier.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor die, comprising:
   an III-V semiconductor body having an active region and a periphery devoid of active devices, the active region having a two-dimensional charge carrier gas, the periphery surrounding the active region and terminating at an edge face of the semiconductor die;
   a seal ring structure having a metal ring above the periphery of the III-V semiconductor body and that encircles the active region of the III-V semiconductor body; and
   a barrier over the periphery of the III-V semiconductor body at least between the seal ring structure and the edge face of the semiconductor die, the barrier having a density which prevents water, water ions, sodium ions and potassium ions from diffusing through the barrier,
   wherein the barrier is in direct contact with at least one of (i) a portion of the III-V semiconductor body, (ii) a portion of a semiconductor substrate on which the III-V semiconductor body is disposed and (iii) a top surface of the metal ring facing away from the III-V semiconductor body.

2. The semiconductor die of claim 1, wherein the barrier comprises silicon oxynitride and/or silicon nitride.

3. The semiconductor die of claim 1, further comprising:
   an insulating layer covering the seal ring structure, the insulating layer having a density which is insufficient to prevent diffusion of water, water ions, sodium ions and potassium ions,
   wherein the barrier covers the insulating layer.

4. The semiconductor die of claim 3, wherein the insulating layer extends to and terminates at a main surface of the III-V semiconductor body facing the seal ring structure, and wherein the barrier covers the insulating layer at the main surface of the III-V semiconductor body so that the insulating layer is not exposed at the main surface.

5. The semiconductor die of claim 3, wherein the insulating layer extends along at least part of the edge face of the semiconductor die, and wherein the barrier covers the insulating layer along the edge face so that the insulating layer is not exposed along the edge face.

6. The semiconductor die of claim 1,
   wherein the semiconductor substrate extends laterally further than the periphery of the III-V semiconductor body so that a step is formed between the III-V semiconductor body and the semiconductor substrate,
   wherein the barrier extends onto the step.

7. The semiconductor die of claim 1, wherein the periphery of the III-V semiconductor body has a sloped sidewall at the edge face of the semiconductor die, and wherein the barrier extends along the sloped sidewall.

8. The semiconductor die of claim 1, wherein the periphery of the III-V semiconductor body has a curved sidewall at the edge face of the semiconductor die, and wherein the barrier extends along the curved sidewall.

9. The semiconductor die of claim 3, wherein the insulating layer has an opening through which the barrier contacts the top surface of the seal ring structure facing away from the III-V semiconductor body.

10. The semiconductor die of claim 3, wherein the barrier contacts the III-V semiconductor body through an opening in the insulating layer which is adjacent a side of the metal ring.

11. The semiconductor die of claim 10, wherein the insulating layer has an additional opening through which the barrier contacts the top surface of the metal ring facing away from the III-V semiconductor body.

12. The semiconductor die of claim 3, wherein the barrier covers the insulating layer so that the insulating layer is not exposed at the edge face of the semiconductor die.

13. The semiconductor die of claim 1, further comprising:
   an additional barrier over the periphery of the III-V semiconductor body and which covers the barrier and the seal ring structure, the additional barrier having a density which prevents water, water ions, sodium ions and potassium ions from diffusing through the additional barrier.

14. The semiconductor die of claim 13, wherein the additional barrier extends onto the edge face of the semiconductor die.

15. The semiconductor die of claim 14, wherein the edge face of the semiconductor die has a sloped sidewall onto which the additional barrier extends.

* * * * *